US012791945B2

(12) United States Patent
Nishimura et al.

(10) Patent No.: US 12,791,945 B2
(45) Date of Patent: Nov. 10, 2026

(54) EXTREME ULTRAVIOLET LIGHT GENERATION SYSTEM AND ELECTRONIC DEVICE MANUFACTURING METHOD

(71) Applicant: Gigaphoton Inc., Tochigi (JP)

(72) Inventors: Yuichi Nishimura, Oyama (JP); Yoshifumi Ueno, Oyama (JP); Kotaro Miyashita, Oyama (JP)

(73) Assignee: Gigaphoton Inc., Tochigi (JP)

( * ) Notice: Subject to any disclaimer, the term of this patent is extended or adjusted under 35 U.S.C. 154(b) by 334 days.

(21) Appl. No.: 18/510,705

(22) Filed: Nov. 16, 2023

(65) Prior Publication Data

US 2024/0184211 A1 Jun. 6, 2024

(30) Foreign Application Priority Data

Dec. 6, 2022 (JP) ................................ 2022-195004

(51) Int. Cl.
*G03F 7/00* (2006.01)
*G03F 1/24* (2012.01)
*H05G 2/00* (2006.01)

(52) U.S. Cl.
CPC ............ *G03F 7/70033* (2013.01); *G03F 1/24* (2013.01); *G03F 7/7085* (2013.01); *H05G 2/0084* (2024.08); *H05G 2/0086* (2024.08); *H05G 2/0088* (2024.08)

(58) Field of Classification Search
CPC . G03F 7/70033; G03F 7/7085; H05G 2/0086; H05G 2/0084; H05G 2/0088; H05G 2/0082
See application file for complete search history.

(56) References Cited

U.S. PATENT DOCUMENTS

| | | | | |
|---|---|---|---|---|
| 8,158,960 B2 * | 4/2012 | Vaschenko | B82Y 10/00 378/143 |
| 10,303,061 B2 * | 5/2019 | Nishimura | G03F 7/70033 |
| 11,968,767 B2 * | 4/2024 | Schlosser | H05G 2/0088 |
| 12,078,934 B2 * | 9/2024 | Rafac | G03F 7/70558 |
| 12,550,245 B2 * | 2/2026 | Ueno | H05G 2/0027 |
| 2014/0333915 A1 * | 11/2014 | Hoogkamp | G03F 7/70033 355/67 |
| 2018/0199422 A1 * | 7/2018 | Yabu | G03F 7/70033 |
| 2018/0284617 A1 * | 10/2018 | Nishimura | G03F 7/70033 |

(Continued)

*Primary Examiner* — Wyatt A Stoffa
(74) *Attorney, Agent, or Firm* — Studebaker Brackett PLLC

(57) ABSTRACT

An extreme ultraviolet light generation system includes a chamber including a first region; a target supply unit supplying a target to the first region; a laser device outputting pulse laser light; an optical system including an optical element to guide the pulse laser light to the first region; an irradiation position adjustment mechanism adjusting a laser irradiation position with respect to the target; an EUV light concentrating mirror arranged such that the pulse laser light passes outside the EUV light concentrating mirror and is guided to the first region; a plurality of EUV sensors measuring radiation energies of the EUV light radiated from the first region in mutually different radiation directions; and a processor controlling the irradiation position adjustment mechanism as setting a target irradiation position of the pulse laser light to a laser irradiation position away from a reference position in a direction toward the EUV light concentrating mirror.

17 Claims, 24 Drawing Sheets

(56) References Cited

U.S. PATENT DOCUMENTS

| | | | | |
|---|---|---|---|---|
| 2021/0364927 | A1* | 11/2021 | Hori .................... | G03F 7/70033 |
| 2021/0410262 | A1* | 12/2021 | Takashima .......... | G03F 7/70025 |
| 2024/0419083 | A1* | 12/2024 | Rafac .................. | G03F 7/70133 |
| 2026/0153806 | A1* | 6/2026 | Chen ................... | G03F 7/70033 |

* cited by examiner

FIG. 3

Sm(x, y) (S11)

| | | X [μm] | | | | | | |
|---|---|---|---|---|---|---|---|---|
| | | -60 | -40 | -20 | 0 | 20 | 40 | 60 |
| Y [μm] | 60 | | | | | | | |
| | 40 | | | | | | | |
| | 20 | | | | | | | |
| | 0 | | | | | | | |
| | -20 | | | | | | | |
| | -40 | | | | | | | |
| | -60 | | | | | | | |

FIG. 5

(S15)

| Eavg [mJ] | | X [μm] | | | | | | |
|---|---|---|---|---|---|---|---|---|
| | | −60 | −40 | −20 | 0 | 20 | 40 | 60 |
| Y [μm] | 60 | 1.74 | 3.53 | 4.69 | 6.82 | 7.63 | 7.15 | 5.58 |
| | 40 | 3.38 | 5.68 | 8.10 | 9.01 | 8.89 | 7.80 | 6.17 |
| | 20 | 5.22 | 7.99 | 9.35 | 9.51 | 9.40 | 8.38 | 6.38 |
| | 0 | 6.47 | 8.32 | 9.56 | 9.61 | 9.30 | 8.07 | 5.84 |
| | −20 | 6.87 | 8.08 | 8.98 | 9.42 | 9.26 | 8.39 | 5.79 |
| | −40 | 6.19 | 6.80 | 7.92 | 8.56 | 8.75 | 8.42 | 6.11 |
| | −60 | 5.36 | 5.35 | 6.73 | 8.32 | 8.36 | 8.46 | 6.64 |

FIG. 6

(S15)

| Eavg [mJ] | | X [μm] | | | | | | |
|---|---|---|---|---|---|---|---|---|
| | | −60 | −40 | −20 | 0 | 20 | 40 | 60 |
| Y [μm] | 60 | | | | 6.82 | | | |
| | 40 | | | | 9.01 | | | |
| | 20 | | | | 9.51 | | | |
| | 0 | 6.47 | 8.32 | 9.56 | 9.61 | 9.30 | 8.07 | 5.84 |
| | −20 | | | | 9.42 | | | |
| | −40 | | | | 8.56 | | | |
| | −60 | | | | 8.32 | | | |

FIG. 9

Sm(x, y) (S19)

| | | X [μm] | | | | | | |
|---|---|---|---|---|---|---|---|---|
| | | −65 | −45 | −25 | −5 | 15 | 35 | 55 |
| Y [μm] | 50 | | | | | | | |
| | 30 | | | | | | | |
| | 10 | | | | | | | |
| | −10 | | | | | | | |
| | −30 | | | | | | | |
| | −50 | | | | | | | |
| | −70 | | | | | | | |

CORRECTION GEOMETRIC CENTROID OF EUV SENSORS ES1 TO ES3

C [rc(k1～k3), θc(k1～k3), φc(k1～k3)]

EXTREME ULTRAVIOLET LIGHT GENERATION SYSTEM AND ELECTRONIC DEVICE MANUFACTURING METHOD

CROSS-REFERENCE TO RELATED APPLICATIONS

The present application claims the benefit of Japanese Patent Application No. 2022-195004, filed on Dec. 6, 2022, the entire contents of which are hereby incorporated by reference.

BACKGROUND

1. Technical Field

The present disclosure relates to an extreme ultraviolet light generation system and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

LIST OF DOCUMENTS

Patent Documents

Patent Document 1: US Patent Application Publication No. 2021/410262

SUMMARY

An extreme ultraviolet light generation system according to an aspect of the present disclosure includes a chamber including a first region; a target supply unit configured to supply a target to the first region; a laser device configured to output pulse laser light; an optical system including an optical element configured to guide the pulse laser light to the first region; an irradiation position adjustment mechanism configured to adjust a laser irradiation position with respect to the target in a plane being perpendicular to an optical path axis of the pulse laser light entering the first region and intersecting the first region by changing a position or posture of the optical element; an EUV light concentrating mirror configured to reflect EUV light radiated from the first region and concentrate the EUV light to a second region, and arranged such that the pulse laser light passes outside the EUV light concentrating mirror and is guided to the first region; a plurality of EUV sensors configured to measure radiation energies of the EUV light radiated from the first region in mutually different radiation directions; and a processor configured to control the irradiation position adjustment mechanism as setting a target irradiation position of the pulse laser light to a laser irradiation position away from a reference position, at which an average value of the radiation energies measured by the EUV sensors is maximized, in a direction toward the EUV light concentrating mirror.

An electronic device manufacturing method according to an aspect of the present disclosure includes generating EUV light using an extreme ultraviolet light generation system; and outputting the EUV light to an exposure apparatus and exposing a photosensitive substrate to the EUV light in the exposure apparatus to manufacture an electronic device. Here, the extreme ultraviolet light generation system includes a chamber including a first region; a target supply unit configured to supply a target to the first region; a laser device configured to output pulse laser light; an optical system including an optical element configured to guide the pulse laser light to the first region; an irradiation position adjustment mechanism configured to adjust a laser irradiation position with respect to the target in a plane being perpendicular to an optical path axis of the pulse laser light entering the first region and intersecting the first region by changing a position or posture of the optical element; an EUV light concentrating mirror configured to reflect the EUV light radiated from the first region and concentrate the EUV light to a second region, and arranged such that the pulse laser light passes outside the EUV light concentrating mirror and is guided to the first region; a plurality of EUV sensors configured to measure radiation energies of the EUV light radiated from the first region in mutually different radiation directions; and a processor configured to control the irradiation position adjustment mechanism as setting a target irradiation position of the pulse laser light to a laser irradiation position away from a reference position, at which an average value of the radiation energies measured by the EUV sensors is maximized, in a direction toward the EUV light concentrating mirror.

An electronic device manufacturing method according to an aspect of the present disclosure includes inspecting a defect of a mask by irradiating the mask with EUV light generated by an extreme ultraviolet light generation system; selecting a mask using a result of the inspection; and exposing and transferring a pattern formed on the selected mask onto a photosensitive substrate. Here, the extreme ultraviolet light generation system includes a chamber including a first region; a target supply unit configured to supply a target to the first region; a laser device configured to output pulse laser light; an optical system including an optical element configured to guide the pulse laser light to the first region; an irradiation position adjustment mechanism configured to adjust a laser irradiation position with respect to the target in a plane being perpendicular to an optical path axis of the pulse laser light entering the first region and intersecting the first region by changing a position or posture of the optical element; an EUV light concentrating mirror configured to reflect the EUV light radiated from the first region and concentrate the EUV light to a second region, and arranged such that the pulse laser light passes outside the EUV light concentrating mirror and is guided to the first region; a plurality of EUV sensors configured to measure radiation energies of the EUV light radiated from the first region in mutually different radiation directions; and a processor configured to control the irradiation position adjustment mechanism as setting a target irradiation position of the pulse laser light to a laser irradiation position away from a reference position, at which an average value of the radiation energies measured by the EUV sensors is maximized, in a direction toward the EUV light concentrating mirror.

BRIEF DESCRIPTION OF THE DRAWINGS

Embodiments of the present disclosure will be described below merely as examples with reference to the accompanying drawings.

FIG. 3 shows an example of a laser irradiation position map.

FIG. 5 shows an example in which all elements of a matrix included in the laser irradiation position map are filled with the measurement result of the average value of the radiation energy.

FIG. 6 shows an example in which only the elements of X=0 and the elements of Y=0 in the matrix included in the laser irradiation position map are filled with the measurement result of the average value of the radiation energy.

FIG. 9 shows an example of the laser irradiation position map newly read with the center coordinate updated.

DESCRIPTION OF EMBODIMENTS

<Contents>

Figure 1:
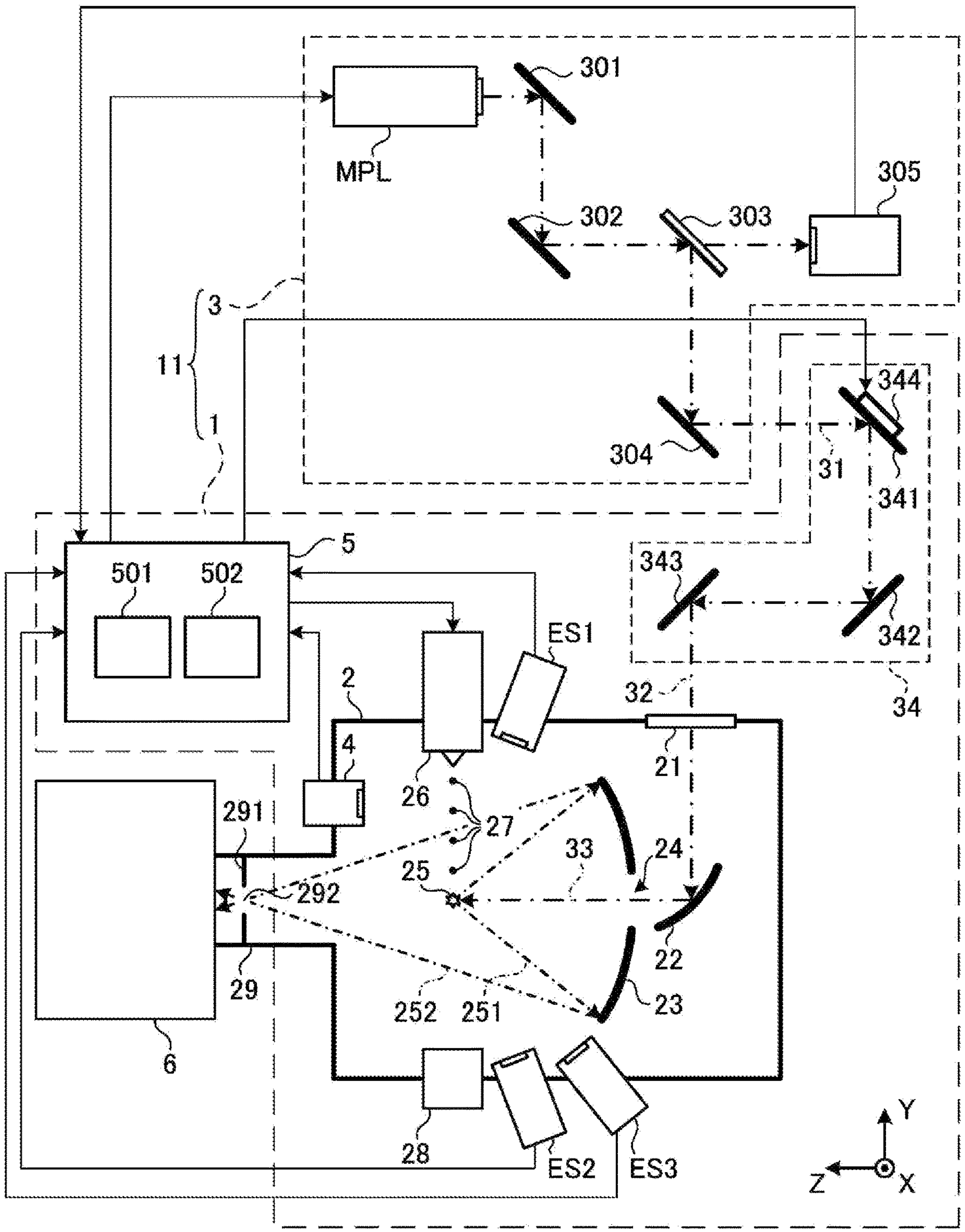
FIG. 1 schematically shows the configuration of an EUV light generation system according to a comparative example.

1. Comparative example
  1.1 Configuration
  1.2 Operation
  1.3 Laser irradiation position adjustment
    1.3.1 Acquisition of laser irradiation position map Sm(x, y)
    1.3.2 Acquisition of average value Eavg for each laser irradiation position
    1.3.3 Calculation of optimum position
    1.3.4 Adjustment of actuator 344
    1.3.5 Further optimization
2. Problem of comparative example
3. EUV light generation system 11*a* with optical path axis of pulse laser light 33 shifted
  3.1 Configuration
  3.2 Laser irradiation position adjustment
    3.2.1 Determination of reference position Pini
    3.2.2 Determination of improved irradiation position Pmax
    3.2.3 Determination of target irradiation position Pop
    3.2.4 Calculation of correction coefficients k1 to k3
    3.2.5 Details of calculation of correction coefficients k1 to k3
      3.2.5.1 Description of correction coefficients k1 to k3
      3.2.5.2 Calculation method of correction coefficients k1 to k3
      3.2.5.3 Verification and correction of correction coefficients k1 to k3
  3.3 Effect
4. EUV light generation system 11*b* including prepulse laser device PPL
  4.1 Configuration
  4.2 Operation
  4.3 Effect
5. Others
  5.1 Example of EUV light utilization apparatus 6
  5.2 Supplement Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Comparative Example

1.1 Configuration

FIG. 1 schematically shows the configuration of an EUV light generation system 11 according to a comparative example. An EUV light generation apparatus 1 is used together with a laser system 3. In the present disclosure, a system including the EUV light generation apparatus 1 and the laser system 3 is referred to as the EUV light generation system 11.

The laser system 3 includes a main pulse laser device MPL, high reflection mirrors 301, 302, 304, a beam splitter 303, and an energy sensor 305. The main pulse laser device MPL corresponds to the laser device in the present discloser, and outputs pulse laser light 31. The pulse energy of the pulse laser light 31 is controlled based on the measurement result of the pulse energy by the energy sensor 305.

The EUV light generation apparatus 1 includes a chamber 2 and a target supply unit 26. The chamber 2 is a sealable container. The target supply unit 26 supplies a target 27 containing a target substance into the chamber 2. The material of the target substance may include tin, terbium, gadolinium, lithium, xenon, or a combination of any two or more thereof.

A through hole is formed in a wall of the chamber 2. The through hole is blocked by a window 21 and pulse laser light 32 output from the laser system 3 passes through the window 21. An EUV light concentrating mirror 23 having a spheroidal reflection surface is arranged in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is arranged such that the first focal point is located in a plasma generation region 25 and the second focal point is located at an intermediate focal point 292. The plasma generation region 25 corresponds to the first region in the present disclosure, and the intermediate focal point 292 corresponds to the second region in the present disclosure. A through hole 24 is formed at the center of the EUV light concentrating mirror 23, and pulse laser light 33 passes through the through hole 24.

The direction directing from the first focal point to the second focal point is represented by the Z direction. The travel direction of the target 27 perpendicular to the Z direction is represented by the −Y direction, and the opposite direction is represented by the Y direction. The direction perpendicular to both the Y direction and the Z direction is represented by the X direction.

The EUV light generation apparatus 1 includes a processor 5, a target sensor 4, EUV sensors ES1 to ES3, and the like. The processor 5 is a processing device including a memory 501 in which a control program is stored, and a central processing unit (CPU) 502 for executing the control program. The processor 5 is specifically configured or programmed to perform various processes included in the present disclosure. The target sensor 4 detects at least one of the presence, trajectory, position, and velocity of the target 27. The target sensor 4 may have an imaging function. Each of the EUV sensors ES1 to ES3 is arranged as being oriented toward the plasma generation region 25, and measures the radiation energy of the EUV light radiated from the plasma generation region 25 in mutually different radiation directions. The EUV sensor ES1 corresponds to the first sensor in the present disclosure, and the EUV sensor ES2 corresponds to the second sensor in the present disclosure.

Further, the EUV light generation apparatus 1 includes a connection portion 29 providing communication between the internal space of the chamber 2 and the internal space of an EUV light utilization apparatus 6. The EUV light utilization apparatus 6 may be an exposure apparatus 6*a* shown in FIG. 24 or an inspection apparatus 6*b* shown in FIG. 25. A wall 291 in which an aperture is formed is arranged in the connection portion 29. The wall 291 is arranged such that the aperture is located at the second focal point of the EUV light concentrating mirror 23.

Further, the EUV light generation apparatus 1 includes a laser light transmission device 34, a laser light concentrating mirror 22, a target collection unit 28 for collecting the target 27, and the like. The laser light transmission device 34 includes high reflection mirrors 341, 342, 343 and an actuator 344. The high reflection mirrors 341, 342, 343 define the transmission state of the laser light, and the actuator 344 adjusts the laser irradiation position by changing the position, posture, and the like of the high reflection mirror 341. The actuator 344 may be arranged at any one of the optical elements from the high reflection mirror 301 to the laser light concentrating mirror 22. The actuator 344 corresponds to the irradiation position adjustment mechanism in the present disclosure, and the optical elements from the high reflection mirror 301 to the laser light concentrating mirror 22 correspond to the optical system in the present disclosure.

1.2 Operation

Operation of the EUV light generation system 11 will be described with reference to FIG. 1. The pulse laser light 31 output from the laser system 3 enters, via the laser light transmission device 34, the chamber 2 through the window 21 as the pulse laser light 32. The pulse laser light 32 travels along a laser light path in the chamber 2, is reflected by the laser light concentrating mirror 22, and is guided to the plasma generation region 25 as the pulse laser light 33.

The target supply unit 26 outputs the target 27 toward the plasma generation region 25 in the chamber 2. The target 27 is irradiated with the pulse laser light 33. The target 27 irradiated with the pulse laser light 33 is turned into plasma, and radiation light 251 is radiated from the plasma. EUV light included in the radiation light 251 is reflected by the EUV light concentrating mirror 23 with higher reflectance than light in other wavelength ranges. Reflection light 252 including the EUV light reflected by the EUV light concentrating mirror 23 is concentrated at the intermediate focal point 292 and output to the EUV light utilization apparatus 6. Here, one target 27 may be irradiated with a plurality of pulses included in the pulse laser light 33.

The processor 5 controls the entire EUV light generation system 11. The processor 5 processes a detection result of the target sensor 4. Based on the detection result of the target sensor 4, the processor 5 controls the timing at which the target 27 is output, the output direction of the target 27, and the like. Further, the processor 5 controls oscillation timing of the laser system 3, a travel direction of the pulse laser light 32, the concentration position of the pulse laser light 33, and the like. The above-described various kinds of control are merely examples, and other control may be added as necessary.

1.3 Laser Irradiation Position Adjustment

Figure 2:
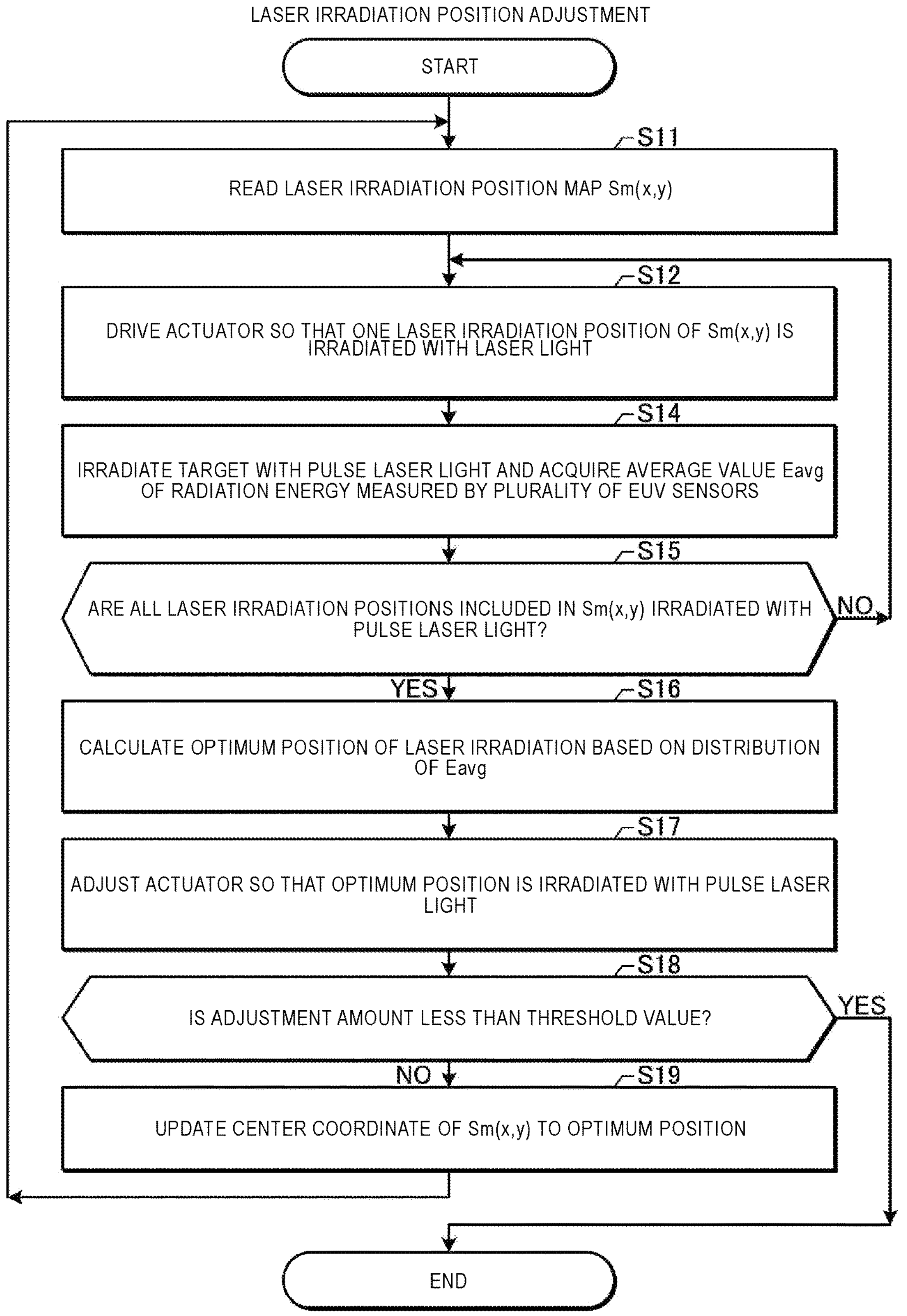
FIG. 2 is a flowchart showing the processing procedure of laser irradiation position adjustment in the comparative example.

FIG. 2 is a flowchart showing the processing procedure of laser irradiation position adjustment in the comparative example. The processing shown in FIG. 2 is performed at the time of initial setting or calibration of the EUV light generation system 11.

1.3.1 Acquisition of Laser Irradiation Position Map Sm(x, y)

In S11, the processor 5 reads a laser irradiation position map Sm(x, y) from a storage device such as a memory 501.

FIG. 3 shows an example of the laser irradiation position map Sm(x, y). The laser irradiation position map Sm(x, y) includes information of a matrix that defines a laser irradiation position in an XY plane perpendicular to the optical path axis of the pulse laser light 33 traveling in the Z direction and intersecting the plasma generation region 25. FIG. 3 shows an example in which the position of x=y=0 is defined as the center coordinate and the laser irradiation position is defined every 20 μm in the ±X direction and the ±Y direction. The position of x=y=0 may be an optimum position set in the past or an optimum position in design. In the following processes from S12 to S15, for example, irradiation of the pulse laser light 33 is sequentially performed from the upper left position in FIG. 3.

1.3.2 Acquisition of Average Value Eavg for Each Laser Irradiation Position

Referring to FIG. 2 again, in S12, the processor 5 drives the actuator 344 so that one laser irradiation position of the laser irradiation position map Sm(x, y) is irradiated with the pulse laser light 33.

In S14, the processor 5 causes the target 27 to be irradiated with the pulse laser light 33, and acquires the average value Eavg of the radiation energies E1 to E3 measured by the plurality of EUV sensors ES1 to ES3.

Figure 4:
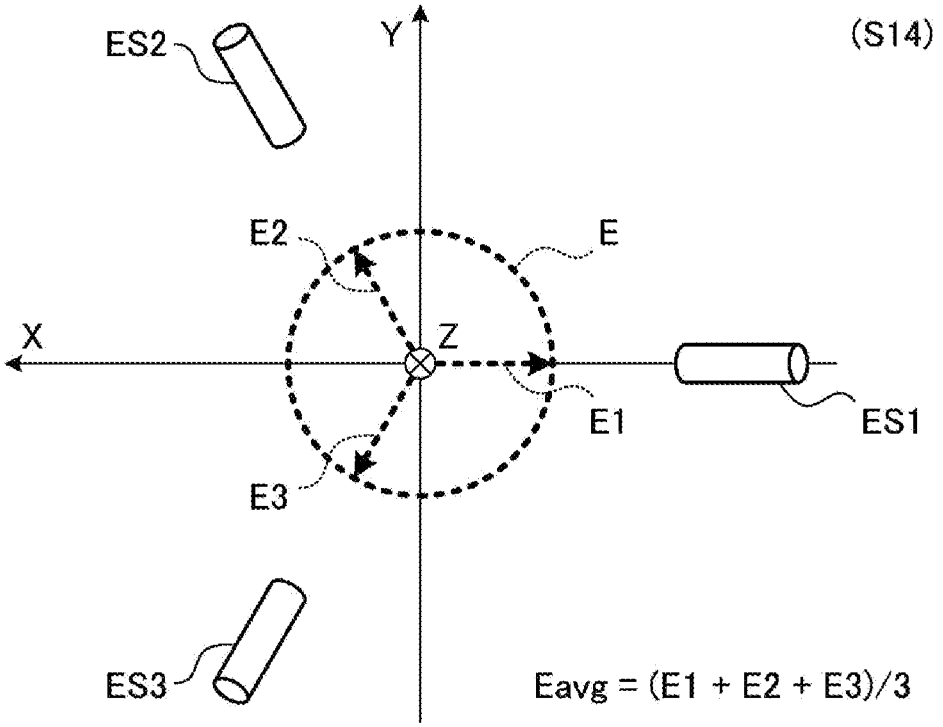
FIG. 4 shows the arrangement of EUV sensors and the magnitude of the radiation energy of EUV light in each radiation direction in the comparative example.

FIG. 4 shows the arrangement of the EUV sensors ES1 to ES3 and the magnitude of the radiation energy E of the EUV light in each radiation direction in the comparative example. The EUV sensors ES1 to ES3 shown in FIG. 4 are arranged, for example, at rotationally symmetric positions around the optical path axis of the pulse laser light 33. In FIG. 4, the radius of the dashed circle indicating the radiation energy E does not indicate the reaching distance of the radiation light 251, but conceptually indicates the magnitude of the radiation energy E of the EUV light in each radiation direction. The length of the arrows indicating the radiation energies E1 to E3 indicates the magnitude of the radiation energies E1 to E3 of the radiation light 251 measured by the EUV sensors ES1 to ES3. The radiation energy E1 corresponds to the first radiation energy in the present disclosure, and the radiation energy E2 corresponds to the second radiation energy in the present disclosure.

Assuming that the optical path axis of the pulse laser light 33 coincides with the center of the target 27, the distribution of the radiation energy E is axisymmetric with respect to the optical path axis of the pulse laser light 33. At this time, the average value Eavg calculated by the following equation is considered to be the maximum value.

$$E\mathrm{avg}=(E1+E2+E3)/3$$

On the other hand, when the optical path axis of the pulse laser light 33 is shifted from the center of the target 27, it is considered that the distribution of the radiation energy E becomes an asymmetric distribution with respect to the optical path axis of the pulse laser light 33, and the average value Eavg decreases.

Therefore, the optimum position of the laser irradiation can be calculated by calculating the average value Eavg at each of the laser irradiation positions included in the laser irradiation position map Sm(x, y).

Referring to FIG. 2 again, in S15, the processor 5 determines whether or not all of the laser irradiation positions included in the laser irradiation position map Sm(x, y) have been irradiated with the pulse laser light 33. When all of the laser irradiation positions have been irradiated with the pulse laser light 33 (S15: YES), the processor 5 advances processing to S16. When there is an unirradiated laser irradiation position (S15: NO), the processor 5 returns processing to S12 and performs irradiation of the unirradiated laser irradiation position.

FIG. 5 shows an example in which all elements of the matrix included in the laser irradiation position map Sm(x, y) are filled with the measurement result of the average value Eavg. FIG. 6 shows an example in which only the elements of X=0 and the elements of Y=0 in the matrix included in the laser irradiation position map Sm(x, y) are filled with the measurement result of the average value Eavg. When all data of the average value Eavg are acquired as shown in FIG. 5, the optimum position of the laser irradiation can be obtained more accurately. When only partial data of the average value Eavg is acquired as shown in FIG. 6, time required for data acquisition and calculation may be reduced.

1.3.3 Calculation of Optimum Position

Referring to FIG. 2 again, in S16, the processor 5 calculates the optimum position of the laser irradiation based on the distribution of the average value Eavg.

Figure 7:
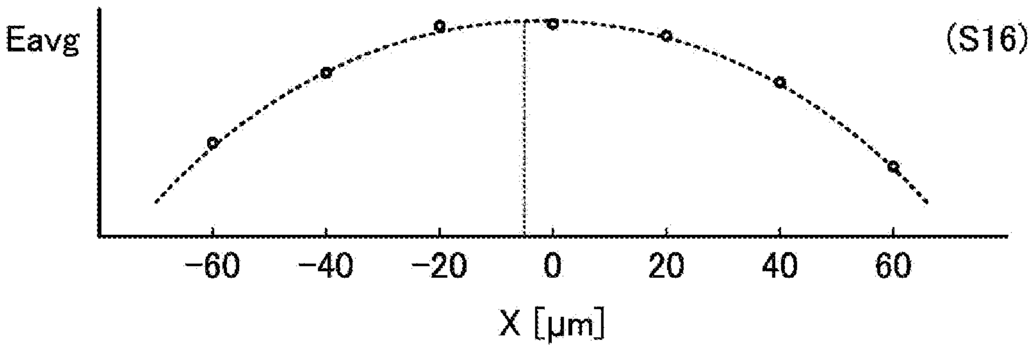
FIG. 7 is a graph showing the distribution of the average value of the radiation energy for each laser irradiation position along the X direction.
Figure 8:
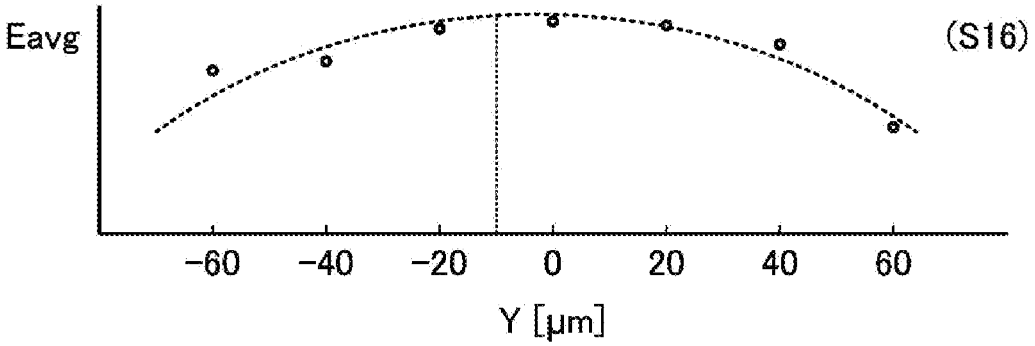
FIG. 8 is a graph showing the distribution of the average value of the radiation energy for each laser irradiation position along the Y direction.

FIG. 7 is a graph showing the distribution of the average value Eavg for each laser irradiation position along the X direction. FIG. 8 is a graph showing the distribution of the average value Eavg for each laser irradiation position along the Y direction. In each of the X direction and the Y direction, an approximate curve is obtained from the distribution of the average value Eavg, and the peak position thereof can be set as the optimum position. Here, not only the average value Eavg but also the sum value may be used.

1.3.4 Adjustment of Actuator 344

Referring to FIG. 2 again, in S17, the processor 5 adjusts the actuator 344 so that the optimum position is irradiated with the pulse laser light 33.

In S18, the processor 5 determines whether or not the adjustment amount in S17 is less than a threshold value. The adjustment amount is an adjustment amount from the center coordinate of the laser irradiation position map Sm(x, y). When the adjustment amount is less than the threshold value (S18: YES), the laser irradiation position adjustment is completed, and the processor 5 ends processing of the present flowchart. When the adjustment amount is equal to or more than the threshold value (S18: NO), the processor 5 advances processing to S19.

1.3.5 Further Optimization

In S19, the processor 5 updates the center coordinate of the laser irradiation position map Sm(x, y) to the optimum position. After S19, the processor 5 returns processing to S11.

FIG. 9 shows an example of the laser irradiation position map Sm(x, y) newly read with the center coordinate updated. FIG. 9 shows an example in which the position of x=−5 [μm], y=−10 [μm] is defined as the center coordinate and the laser irradiation position is defined every 20 μm in the ±X direction and the ±Y direction. Further optimization can be performed by reacquiring the average value Eavg using the laser irradiation position map Sm(x, y) centered at the optimum position.

2. Problem of Comparative Example

Figure 10:
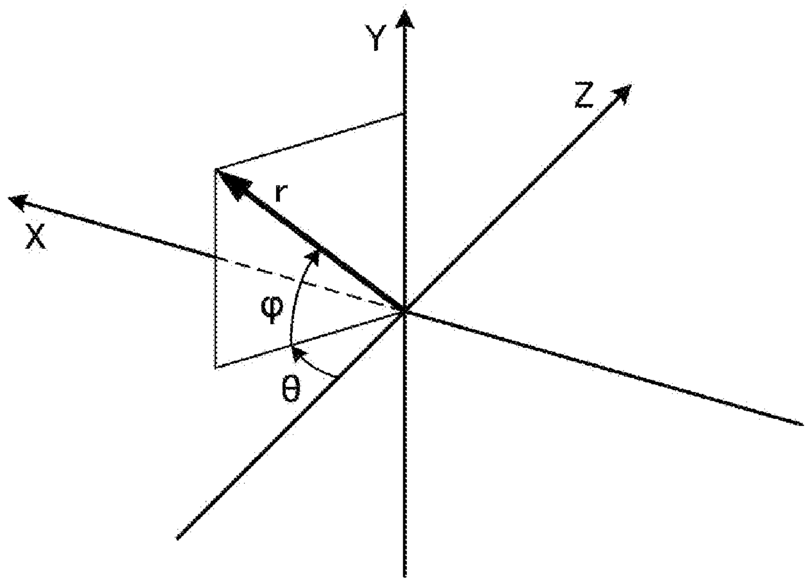
FIG. 10 shows the definition of a polar coordinate system used in the present disclosure.

FIG. 10 shows the definition of a polar coordinate system used in the present disclosure. One point in the plasma generation region 25 is defined as the origin, and the distance from the origin is defined as r. The rotation angle around the Y axis is defined as θ. The inclination angle with respect to the XZ plane is defined as Φ. The direction in which θ=Φ=0 is satisfied coincides with the −Z direction.

Figure 11:
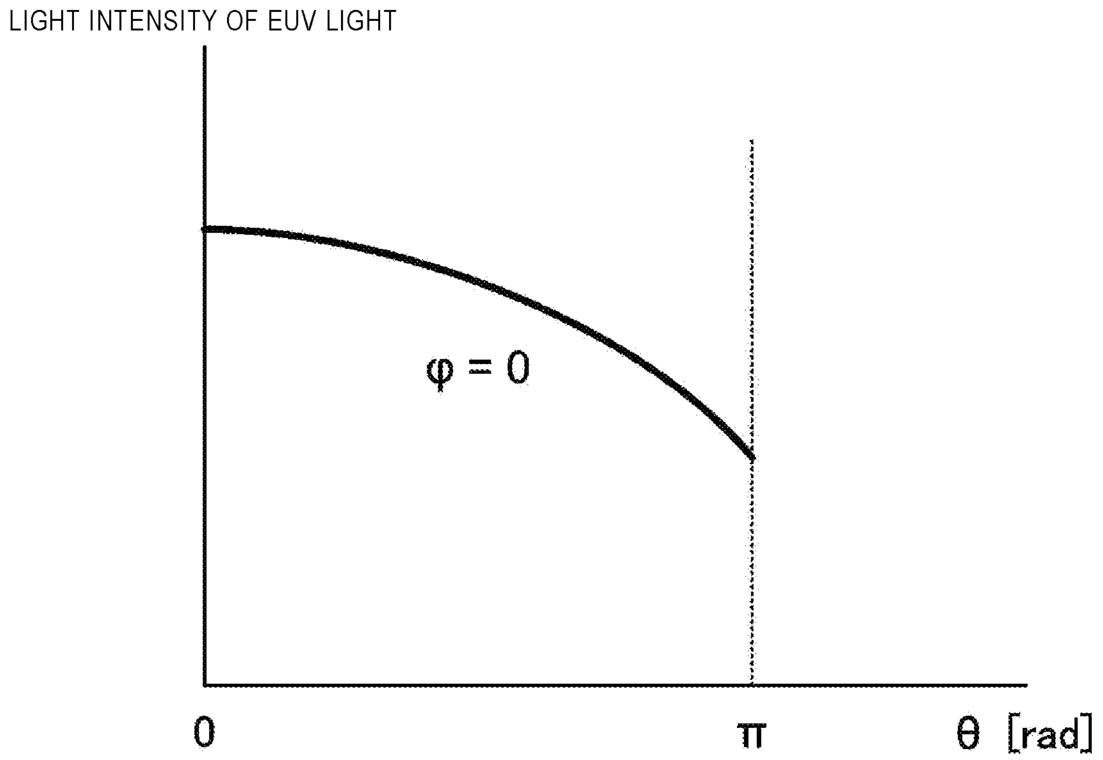
FIG. 11 is a graph showing the light intensity distribution of the EUV light radiated from the plasma generation region in each radiation direction.

FIG. 11 is a graph showing the light intensity distribution of the EUV light radiated from the plasma generation region 25 in each radiation direction. When the inclination angle Φ is set to 0 and the rotation angle θ is changed from 0 to π [rad], the light intensity of the EUV light radiated in the direction opposite to the incident direction of the pulse laser light 33 with respect to the target 27, that is, in the direction of θ=0 is the highest. Then, the light intensity of the EUV light radiated in the same direction as the incident direction of the pulse laser light 33 with respect to the target 27, that is, in the direction of θ=π is the lowest.

Figure 12:
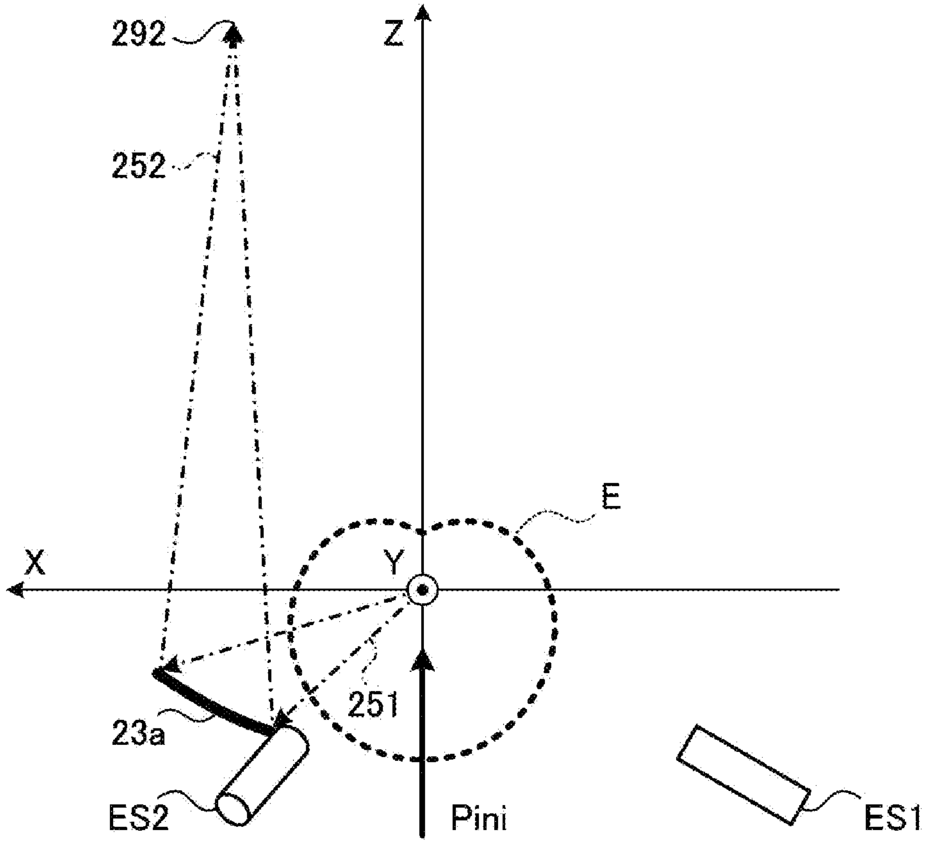
FIG. 12 shows the arrangement of the EUV sensors and the EUV light concentrating mirror and the magnitude of the radiation energy of the EUV light in each radiation direction.
Figure 13:
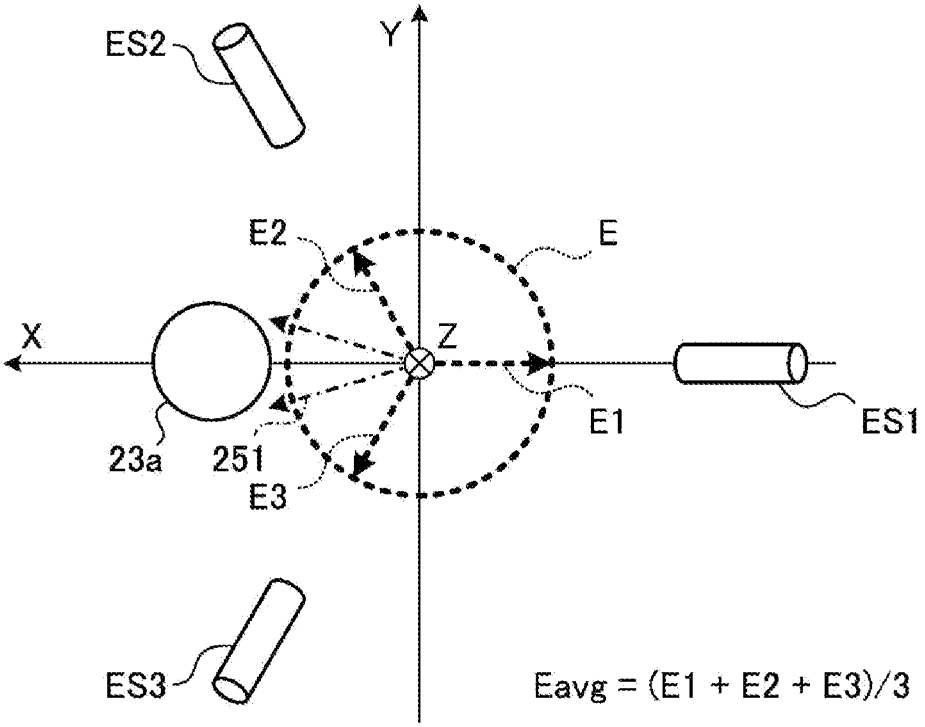
FIG. 13 shows the arrangement of the EUV sensors and the EUV light concentrating mirror and the magnitude of the radiation energy of the EUV light in each radiation direction.

FIGS. 12 and 13 show the arrangement of the EUV sensors ES1 to ES3 and the EUV light concentrating mirror 23*a* and the magnitude of the radiation energy E of the EUV light in each radiation direction. However, in FIG. 12, the EUV sensor ES3 is not shown because it overlaps the EUV sensor ES2 in the Y direction. When the optical path axis of the pulse laser light 33 coincides with the center of the target 27, as shown in FIG. 13, the distribution of the radiation energy E becomes an axisymmetric distribution with respect to the Z axis, which is the same as that described with reference to FIG. 4.

However, as described with reference to FIG. 11, when the rotation angle θ around the Y axis changes, the light intensity changes. Therefore, as shown in FIG. 12, although the radiation energy E in the −Z direction is large, the radiation energy E may decrease as the distance from the −Z direction is increased. When the EUV light concentrating mirror 23*a* is arranged at a position away from the −Z direction, a portion, of the EUV light radiated in each radiation direction, in which the radiation energy E indicates the peak value is not incident on the EUV light concentrating mirror 23*a*, and a part thereof in which the radiation energy E is smaller than the peak value is incident on the EUV light concentrating mirror 23*a*. Therefore, the ratio of the portion, of the EUV light radiated from the plasma generation region 25, which is incident on the EUV light concentrating mirror 23*a* is low, and the output energy of the EUV light output to the EUV light utilization apparatus 6 may be insufficient.

Embodiments of the present disclosure described below relate to improving output energy of the EUV light by shifting the optical path axis of the pulse laser light 33 away from a reference position Pini in a direction toward the EUV light concentrating mirror 23*a*.

3. EUV Light Generation System 11*a* with Optical Path Axis of Pulse Laser Light 33 Shifted

3.1 Configuration

Figure 14:
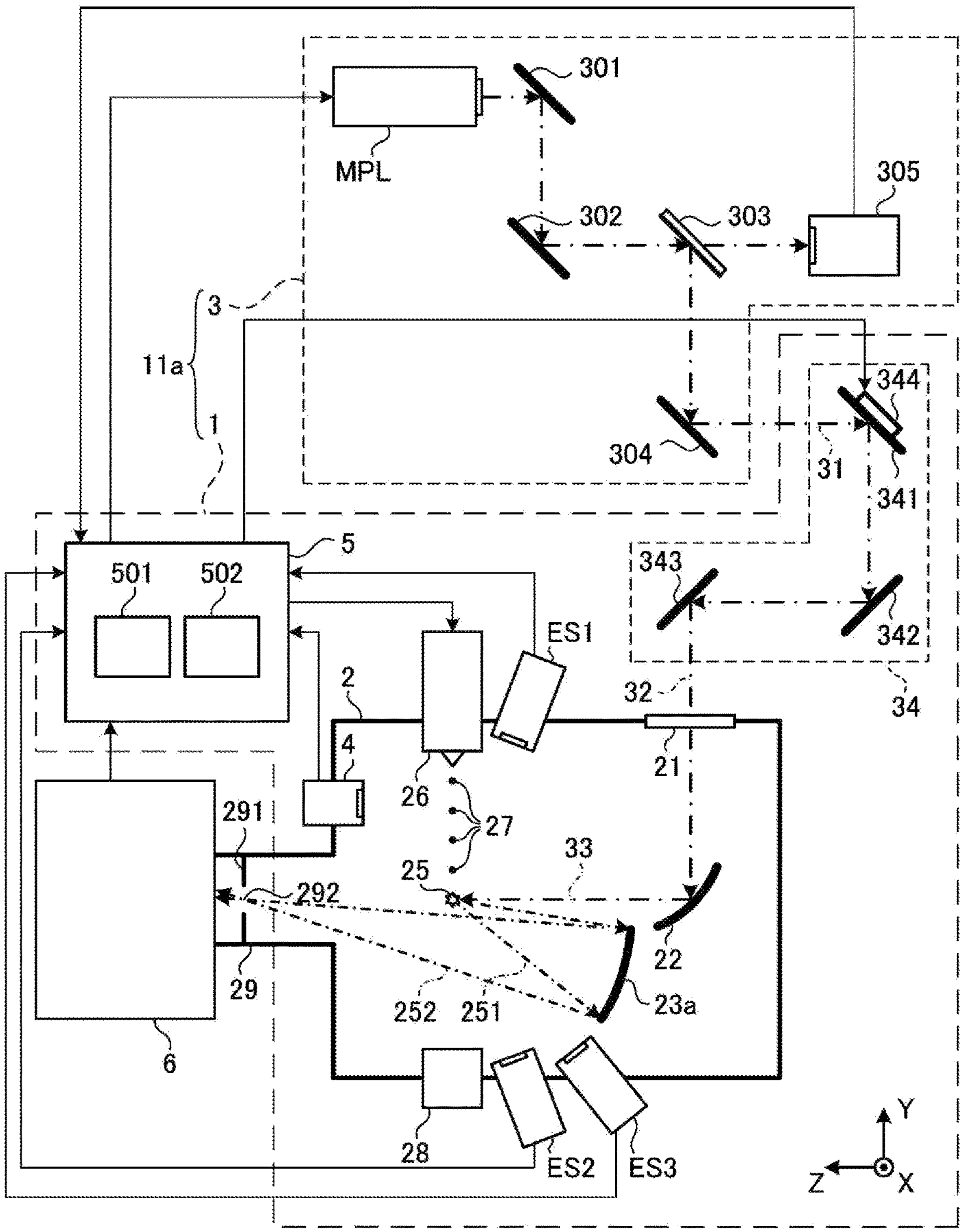
FIG. 14 schematically shows the configuration of the EUV light generation system according to a first embodiment.

FIG. 14 schematically shows the configuration of an EUV light generation system 11*a* according to a first embodiment. The EUV light concentrating mirror 23*a* is arranged at a position shifted from the optical path axis of the pulse laser light 33. In the comparative example, as shown in FIG. 1, the pulse laser light 33 passes through the through hole 24 of the EUV light concentrating mirror 23 and is concentrated on the plasma generation region 25, whereas in the first embodiment, the pulse laser light 33 passes outside the EUV light concentrating mirror 23*a* and is concentrated on the plasma generation region 25. As also shown in FIG. 13, the EUV sensor ES2 or ES3 has a smaller deviation in the direction centered at the plasma generation region 25 with respect to the EUV light concentrating mirror 23*a* compared with the EUV sensor ES1. That is, the angle, with a point in the plasma generation region 25 being as an apex, between the position of the EUV sensor ES2 or ES3 and the position of the EUV light concentrating mirror 23*a* is smaller than the angle, with the point in the plasma generation region 25 being as an apex, between the position of the EUV sensor ES1 and the position of the EUV light concentrating mirror 23*a*.

In the first embodiment, a signal line connecting the EUV light utilization apparatus 6 and the processor 5 is added. The EUV light utilization apparatus 6 measures the output energy of the EUV light reaching the intermediate focal point 292 and transmits the measurement result to the processor 5 via the signal line. The processor 5 receives the output energy from the EUV light utilization apparatus 6. The EUV light utilization apparatus 6 may be the exposure apparatus 6*a*, the inspection apparatus 6*b*, or a measurement instrument for measuring the output energy of the EUV light reaching the intermediate focal point 292.

3.2 Laser Irradiation Position Adjustment

Figure 15:
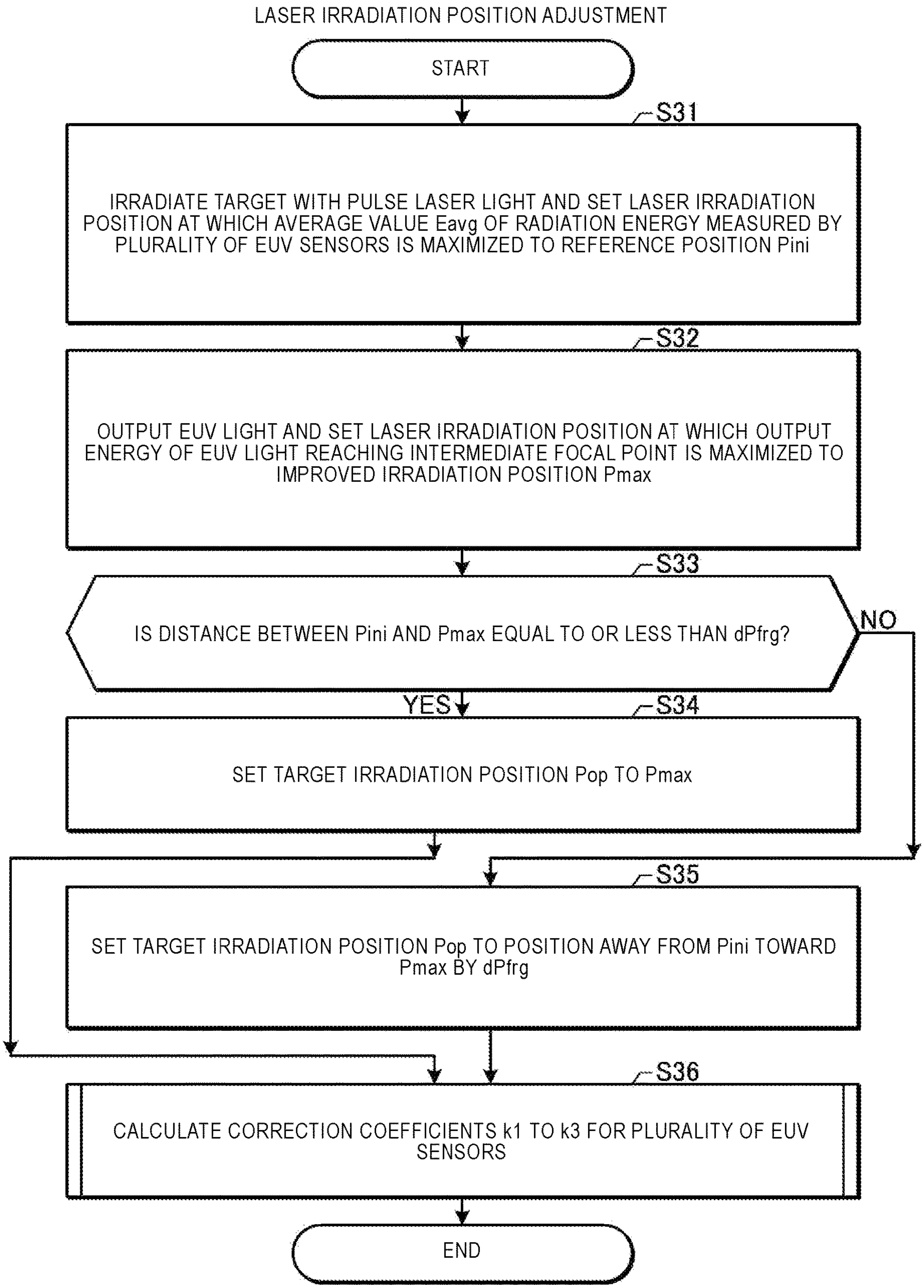
FIG. 15 is a flowchart showing the processing procedure of the laser irradiation position adjustment in the first embodiment.

FIG. 15 is a flowchart showing the processing procedure of the laser irradiation position adjustment in the first embodiment. The processing shown in FIG. 15 is performed at the time of initial setting or calibration of the EUV light generation system 11*a*.

3.2.1 Determination of Reference Position Pini

In S31, the processor 5 causes the target 27 to be irradiated with the pulse laser light 33, and sets the laser irradiation position at which the average value Eavg of the radiation energies E1 to E3 measured by the plurality of EUV sensors ES1 to ES3 is maximized as the reference position Pini. This processing is similar to that of the laser irradiation position adjustment described with reference to FIG. 2. The optimum position calculated in FIG. 2 corresponds to the reference position Pini in FIG. 15. The reference position Pini is, for example, shown in FIG. 12, and is the laser irradiation position at which the optical path axis of the pulse laser light 33 coincides with the center of the target 27.

3.2.2 Determination of Improved Irradiation Position Pmax

In S32, the processor 5 causes the EUV light to be output toward the EUV light utilization apparatus 6, and receives the measurement result of the output energy of the EUV light reaching the intermediate focal point 292 for each laser irradiation position. The laser irradiation position at this time is set to gradually move from the reference position Pini in the direction toward the EUV light concentrating mirror 23*a* in the XY plane, for example. The processor 5 sets the laser irradiation position at which the output energy is higher than that when the reference position Pini is irradiated with the pulse laser light 33 as an improved irradiation position Pmax. The improved irradiation position Pmax is preferably the laser irradiation position at which the output energy is maximized.

Figure 17:
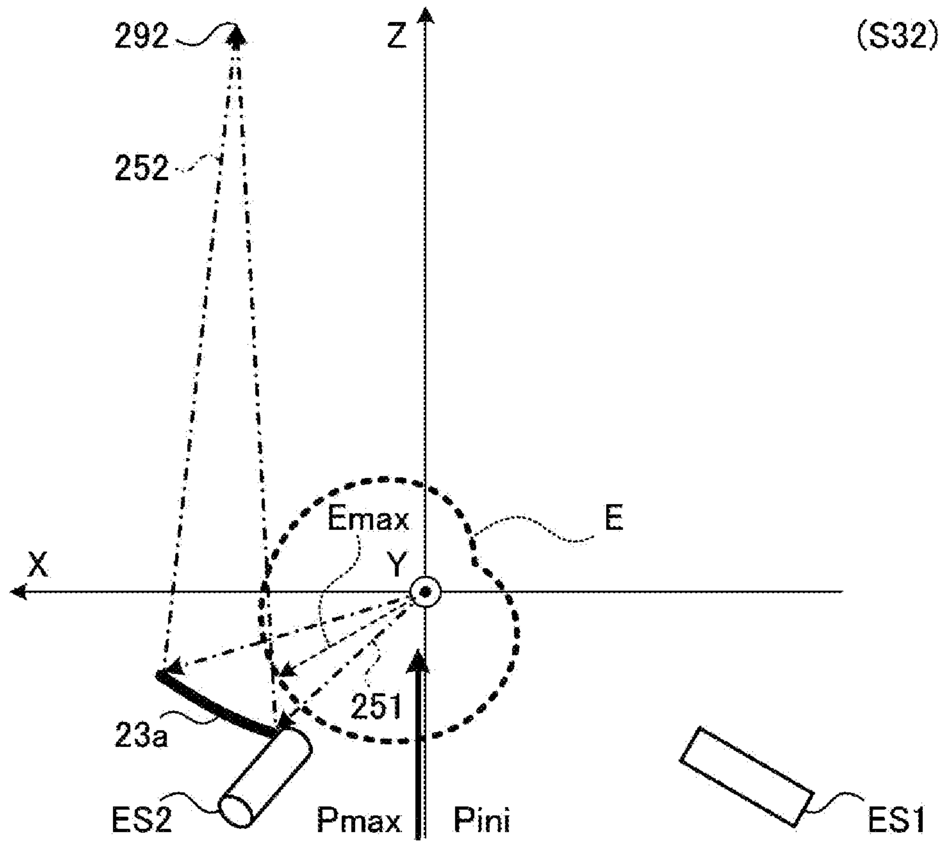
FIG. 17 shows the magnitude of the radiation energy of the EUV light in each radiation direction when an improved irradiation position is irradiated with the pulse laser light.

FIG. 17 shows the magnitude of the radiation energy E in each radiation direction when the improved irradiation position Pmax is irradiated with the pulse laser light 33. By shifting the laser irradiation position, the distribution of the radiation energy E can be inclined. When a portion Emax at which the radiation energy E of the EUV light radiated in each radiation direction indicates the peak value is incident on the vicinity of the center of the EUV light concentrating mirror 23*a*, the output energy is maximized.

3.2.3 Determination of Target Irradiation Position Pop

Referring to FIG. 15 again, in S33, the processor 5 determines whether or not the distance between the reference position Pini and the improved irradiation position Pmax is equal to or less than an allowable value dPfrg. The allowable value dPfrg is set in advance based on whether or not the generation amount of debris derived from the target 27 becomes equal to or less than an allowable value. The allowable value dPfrg is set to be less than the radius of the target 27, for example, 3 μm or more and 8 μm or less. When the distance between the reference position Pini and the improved irradiation position Pmax is equal to or less than the allowable value dPfrg (S33: YES), the processor 5 advances processing to S34. When the distance between the reference position Pini and the improved irradiation position Pmax is more than the allowable value dPfrg (S33: NO), the processor 5 advances processing to S35.

Figure 18:
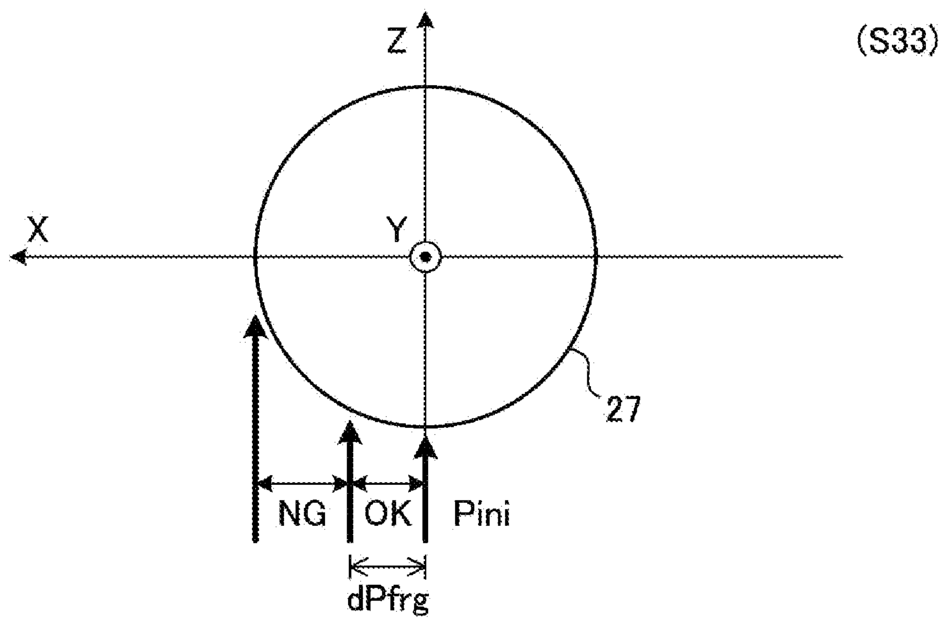
FIG. 18 shows the positional relationship between a target and an optical path axis of the pulse laser light.

FIG. 18 shows the positional relationship between the target 27 and the optical path axis of the pulse laser light 33. FIG. 18 is viewed in the same direction as FIG. 17, but shows a range, in an enlarged manner, narrower than FIG. 17 does. As shown in FIG. 18, the generation amount of debris is equal to or less than the allowable value as far as a position away from the reference position Pini by the allowable value dPfrg, and in this case, the process of S34 is performed. When the position is further away from the position away from the reference position Pini by the allowable value dPfrg, the generation of debris may suddenly increase, and the process of S35 is performed.

Referring to FIG. 15 again, in S34, the processor 5 sets the target irradiation position Pop to the improved irradiation position Pmax. In S35, the processor 5 sets the target irradiation position Pop to a position away from the reference position Pini in a direction toward the improved irradiation position Pmax by the allowable value dPfrg. In both cases, the target irradiation position Pop is set to a position away from the reference position Pini in the direction toward the improved irradiation position Pmax. In both cases, the distance between the reference position Pini and the target irradiation position Pop is equal to or less than the allowable value dPfrg.

3.2.4 Calculation of Correction Coefficients k1 to k3

After S34 or S35, in S36, the processor 5 calculates correction coefficients k1 to k3 of the plurality of EUV sensors ES1 to ES3. The correction coefficients k1 to k3 are used to calculate a correction average value Ewavg instead of the average value Eavg. In the comparative example, the optical path axis of the pulse laser light 33 is brought close to the center of the target 27 by controlling the laser irradiation position so that the average value Eavg increases, whereas in the first embodiment, the optical path axis is brought close to the target irradiation position Pop by controlling the laser irradiation position so that the correction average value Ewavg increases. Specifically, the laser irradiation position is controlled so that the correction average value Ewavg is maximized. Details of S36 will be described with reference to FIG. 16. When the process of S36 is completed, the laser irradiation position adjustment is completed, and the processor 5 ends processing of the present flowchart.

3.2.5 Details of Calculation of Correction Coefficients k1 to k3

Figure 16:
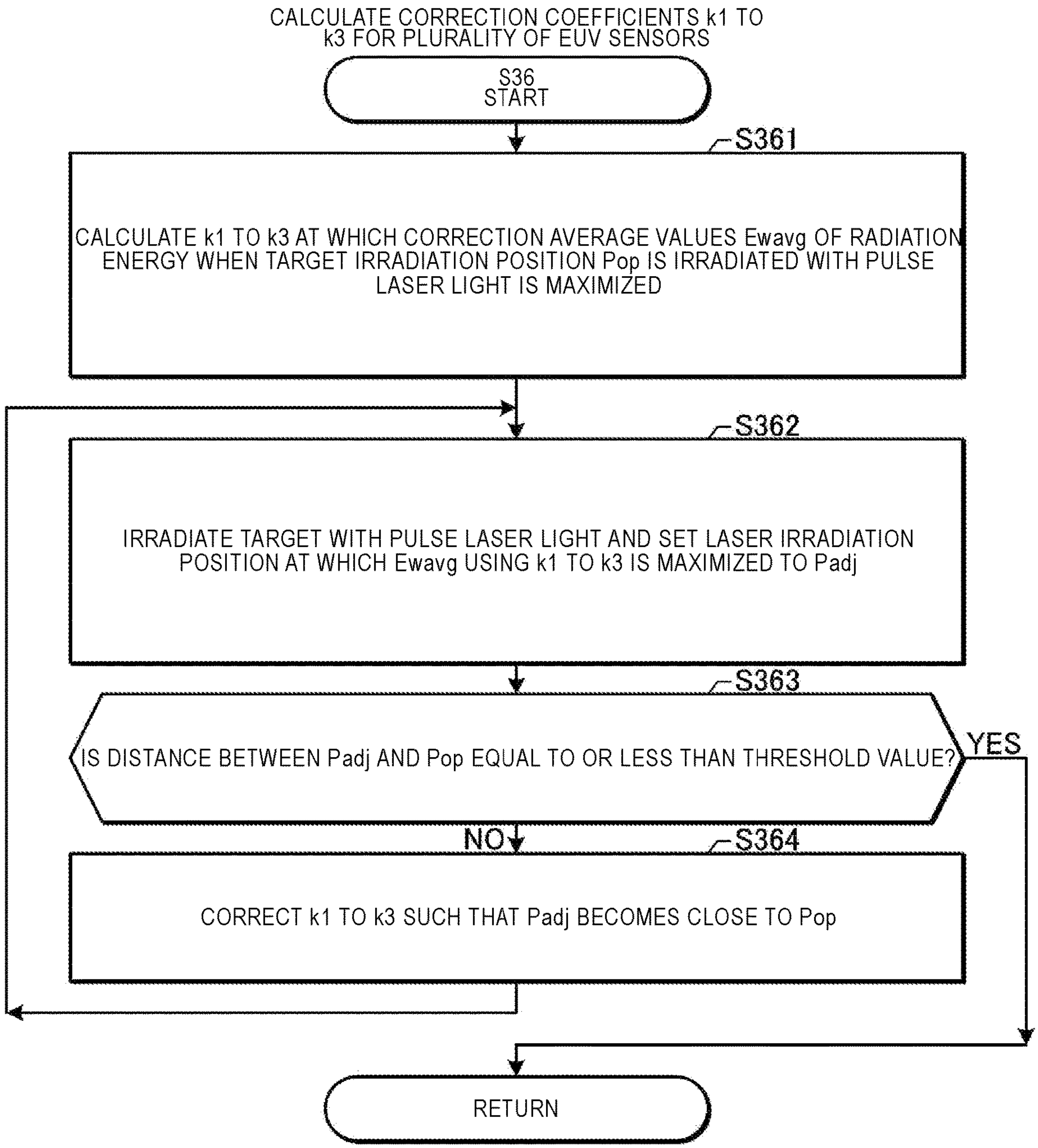
FIG. 16 is a flowchart showing details of the processing of calculation of the correction coefficients.

FIG. 16 is a flowchart showing details of the processing of calculation of the correction coefficients k1 to k3. The processing shown in FIG. 16 corresponds to the subroutine of S36 in FIG. 15.

3.2.5.1 Description of Correction Coefficients k1 to k3

In S361, the processor 5 calculates the correction coefficients k1 to k3 such that the correction average value Ewavg of the radiation energies E1 to E3 is larger when the target irradiation position Pop is irradiated with the pulse laser light 33 than when the reference position Pini is irradiated with the pulse laser light. Specifically, the correction coefficients k1 to k3 that maximize the correction average value Ewavg when the target irradiation position Pop is irradiated with the pulse laser light 33 is calculated.

Figure 19:
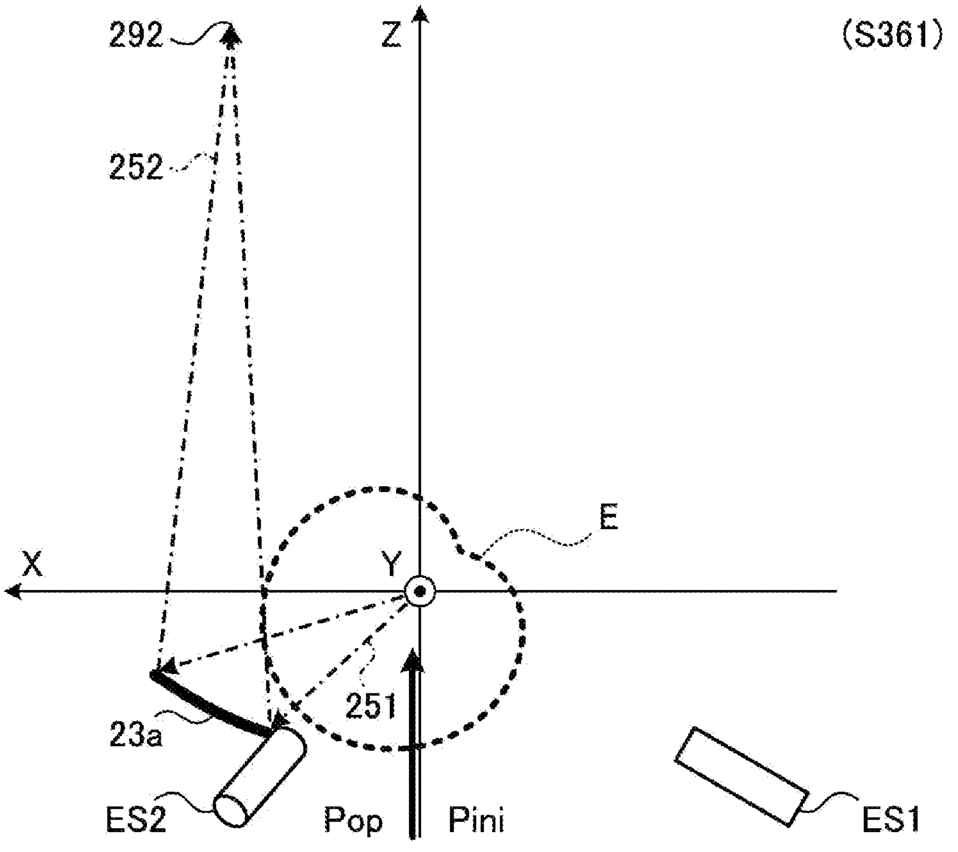
FIG. 19 shows the magnitude of the radiation energy of the EUV light in each radiation direction when a target irradiation position is irradiated with the pulse laser light.
Figure 20:
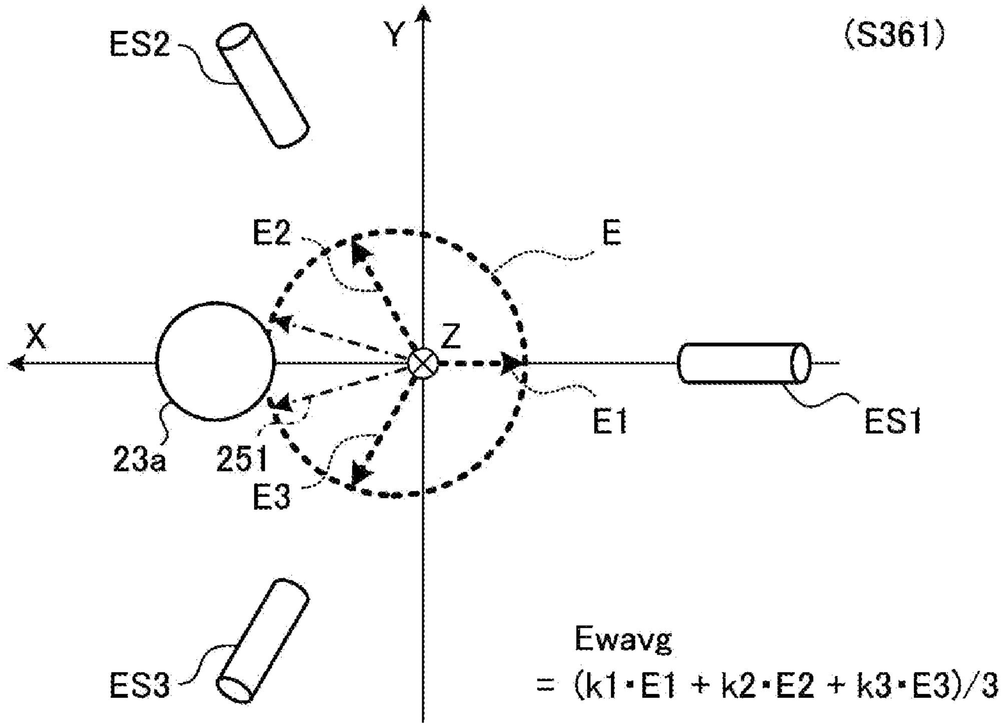
FIG. 20 shows the magnitude of the radiation energy of the EUV light in each radiation direction when the target irradiation position is irradiated with the pulse laser light.

FIGS. 19 and 20 show the magnitude of the radiation energy E of the EUV light in each radiation direction when the target irradiation position Pop is irradiated with the pulse laser light 33. The arrangement of the EUV sensors ES1 to ES3 and the EUV light concentrating mirror 23*a* is similar to those in FIGS. 12 and 13. By changing the laser irradiation position, the distribution of the radiation energy E can be inclined, and by changing the inclination of the distribution of the radiation energy E, the ratio of the radiation energies E1 to E3 measured by the EUV sensors ES1 to ES3 is changed as shown in FIG. 20. Therefore, when the correction coefficients k1 to k3 are appropriately set, the target irradiation position Pop can be irradiated with the pulse laser light 33 when the laser irradiation position is controlled such that the correction average value Ewavg is maximized. The correction average value Ewavg is calculated by the following equation.

$$Ewavg=(k1\cdot E1+k2\cdot E2+k3\cdot E3)/3$$

For example, when the correction coefficients k2, k3 are set to values larger than the correction coefficient k1, the correction average value Ewavg becomes larger by increasing the radiation energies E2, E3 than by increasing the radiation energy E1. By maximizing the correction average value Ewavg thus set, the radiation energies E2, E3 are increased, and the peak of the radiation energy E of the EUV light is inclined in the X direction, that is, in the direction toward the EUV light concentrating mirror 23*a*, so that the energy of the EUV light being incident on the EUV light concentrating mirror 23*a* can be increased. Here, the present invention is not limited to the case in which the correction average value Ewavg of the radiation energies E1 to E3 is used, but also the sum value obtained by weighting the radiation energies E1 to E3 by the correction coefficients k1 to k3 may be used.

3.2.5.2 Calculation Method of Correction Coefficients k1 to k3

The correction coefficients k1 to k3 can be calculated as follows based on positional deviation dP(dx, dy) from the reference position Pini to the target irradiation position Pop.

Figure 21:
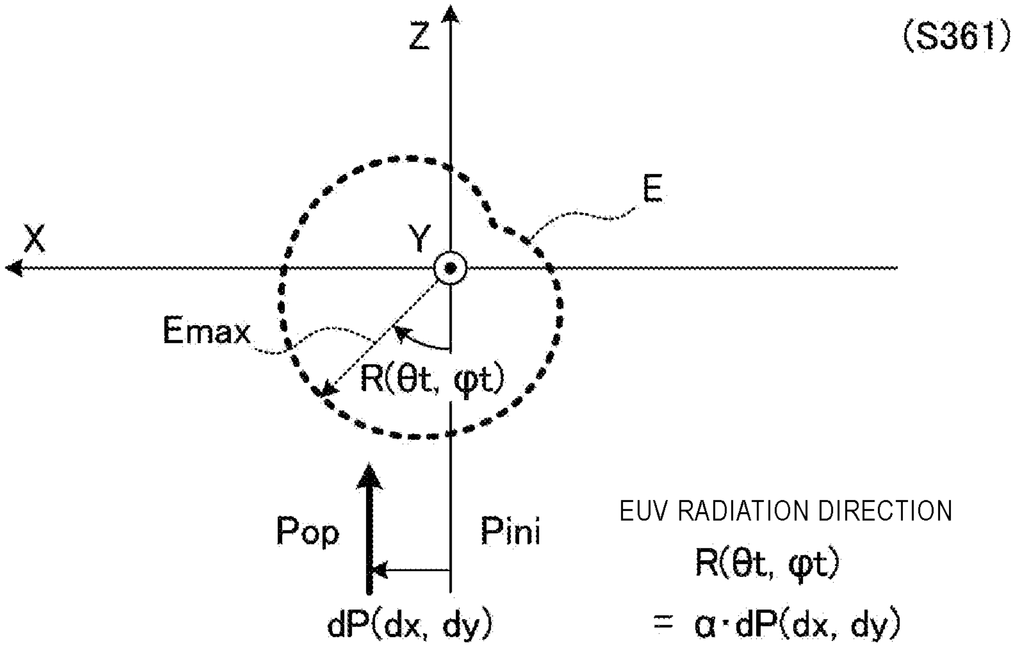
FIG. 21 shows the relationship between the positional deviation from a reference position to the target irradiation position and the EUV radiation direction.

FIG. 21 shows the relationship between the positional deviation dP(dx, dy) and an EUV radiation direction R(θt, Φt). FIG. 21 is viewed in the same direction as FIG. 19, but shows a range narrower than that of FIG. 19 in an enlarged manner. The EUV radiation direction R(θt, Φt) is a radiation direction of a portion, of the EUV light radiated in each radiation direction, in which the radiation energy E is larger than the radiation energy in the −Z direction, and is preferably a radiation direction of a portion Emax indicating a peak value of the radiation energy E. The positional deviation dP(dx, dy) and the EUV radiation direction R(θt, Φt) can be regarded as having linearity within a certain range. The coefficient thereof can be obtained from data measured in advance and can be represented by a matrix α. For example, when the laser irradiation position is moved by 1 μm, the radiation direction of the portion Emax indicating a peak value of the radiation energy E changes by about 5° to 6°. The EUV radiation direction R(θt, Φt) when the target irradiation position Pop is irradiated with the pulse laser light 33 can be calculated by the following equation using the matrix α.

$$R(\theta t,\Phi t)=\alpha\cdot dP(dx,dy)$$

Figure 22:
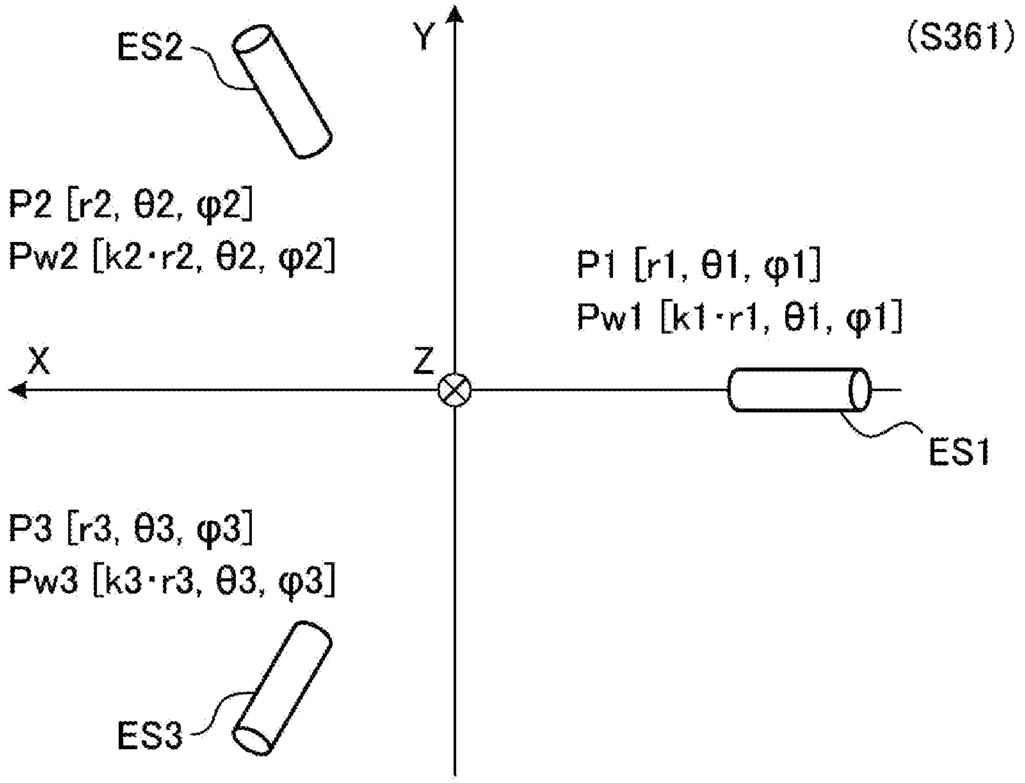
FIG. 22 shows the arrangement of the EUV sensors.

FIG. 22 shows the arrangement of the EUV sensors ES1 to ES3. The positions of the EUV sensors ES1 to ES3 are, for example, the center positions of the light receiving surface of the EUV sensors ES1 to ES3. The positions of the EUV sensors ES1 to ES3 can be represented by position vectors P1 to P3 using polar coordinates as follows. The position vector P1 corresponds to the first position vector in the present disclosure, and the position vector P2 corresponds to the second position vector in the present disclosure.

P1[r1, θ1, Φ1]

P2[r2, θ2, Φ2]

P3[r3, θ3, Φ3]

When these position vectors P1 to P3 are weighted by the correction coefficients k1 to k3, the following correction position vectors Pw1 to Pw3 are given.

Pw1[k1·r1, θ1, Φ1]

Pw2[k2·r2, θ2, Φ2]

Pw3[k3·r3, θ3, Φ3]

For example, increasing the correction coefficients k2, k3 corresponds to extending the sum of the correction position vectors Pw2, Pw3 in the X direction and the −Z direction.

The geometric centroid of the correction position vectors Pw1 to Pw3 is referred to as the correction geometric centroid vector C of the EUV sensors ES1 to ES3, and the correction geometric centroid vector C can be expressed as follows.

$$C=[rc(k1,k2,k3),\theta c(k1,k2,k3),\Phi c(k1,k2,k3)]$$

For example, increasing the correction coefficients k2, k3 larger than the correction coefficient k1 corresponds to inclining the correction geometric centroid vector C in the X direction. As described with reference to FIGS. 19 and 20, by setting the correction coefficients k2, k3 larger than the correction coefficient k1 to maximize the correction average value Ewavg, the peak of the radiation energy E of the EUV light can be inclined in the X direction, and the energy of the EUV light being incident on the EUV light concentrating mirror 23*a* can be increased. The direction component of the correction geometric centroid vector C perpendicular to the optical path axis of the pulse laser light 33 is preferably oriented in the direction toward the EUV light concentrating mirror 23*a* from the optical path axis.

From the above description, setting the correction coefficients k1 to k3 such that the correction geometric centroid vector C is inclined in the X direction corresponds to inclining the peak of the radiation energy E of the EUV light in the X direction. When the direction of the correction geometric centroid vector C becomes close to the EUV radiation direction R(θt, Φt), the correction average value Ewavg increases, and when the direction of the correction geometric centroid vector C coincides with the EUV radiation direction R(θt, Φt), the correction average value Ewavg is maximized. Therefore, the correction coefficients k1 to k3 can be calculated such that an objective function O given by the following equation is minimized.

$$O=(\theta t-\theta c(k1,k2,k3))^2+(\Phi t-\Phi c(k1,k2,k3))^2$$

Here, the correction coefficients k1 to k3 are all set to 1 or more, magnitude rc(k1, k2, k3) of the correction geometric centroid vector C is set to 0 or more, θc(k1, k2, k3) is set to −π or more and π or less, and Φc(k1, k2, k3) is set to −π/2 or more and π/2 or less.

Here, the case in which the correction coefficients k1 to k3 for calculating the correction average value Ewavg are calculated using the three EUV sensors ES1 to ES3 has been described, but the correction coefficients k1, k2, . . . , ki for calculating the correction average value Ewavg may be calculated using three or more EUV sensors ES1, ES2, . . . , ESi.

3.2.5.3 Verification and Correction of Correction Coefficients k1 to k3

Referring to FIG. 16 again, the processing of verifying whether or not the calculated correction coefficients k1 to k3 are appropriate and correcting the correction coefficients k1 to k3 will be described.

In S362, the processor 5 causes the target 27 to be irradiated with the pulse laser light 33, and controls the laser irradiation position so that the correction average value Ewavg calculated using the correction coefficients k1 to k3 is maximized. The processor 5 sets that laser irradiation position as an adjusted irradiation position Padj.

In S363, the processor 5 determines whether or not the distance between the adjusted irradiation position Padj and the target irradiation position Pop is less than a threshold value. When the distance is less than the threshold value (S363: YES), the processor 5 ends processing of the present flowchart and returns to processing shown in FIG. 15. When the distance is equal to or more than the threshold (S363: NO), the processor 5 advances processing to S364.

In S364, the processor 5 corrects the correction coefficients k1 to k3 so that the adjusted irradiation position Padj becomes close to the target irradiation position Pop. For example, when the adjusted irradiation position Padj is shifted in the −X direction with respect to the target irradiation position Pop, the correction coefficient k1 of the EUV sensor ES1 is decreased or the correction coefficients k2, k3 of the EUV sensors k2, k3 are increased in order to adjust the adjusted irradiation position Padj in the X direction.

After S364, the processor 5 returns processing to S362, and verifies again whether or not the corrected correction coefficients k1 to k3 are appropriate.

3.3 Effect (1) According to the first embodiment, the EUV light generation system 11*a* includes the chamber 2, the target supply unit 26, the main pulse laser device MPL, the optical system including the high reflection mirror 341, the actuator 344, the EUV light concentrating mirror 23*a*, the plurality of EUV sensors ES1, ES2, and the processor 5. The chamber 2 includes the plasma generation region 25. The target supply unit 26 supplies the target 27 to the plasma generation region 25. The main pulse laser device MPL outputs the pulse laser light 33. The optical system including the high reflection mirror 341 guides the pulse laser light 33 to the plasma generation region 25. The actuator 344 adjusts the laser irradiation position on the target 27 in the XY plane perpendicular to the optical path axis of the pulse laser light 33 entering the plasma generation region 25 and intersecting the plasma generation region 25 by changing the position or posture of the high reflection mirror 341. The EUV light concentrating mirror 23*a* reflects the EUV light radiated from the plasma generation region 25 and concentrates the EUV light at the intermediate focal point 292, and is arranged such that the pulse laser light 33 passes outside the EUV light concentrating mirror 23*a* and is guided to the plasma generation region 25. The EUV sensors ES1, ES2 measure the radiation energy E of the EUV light radiated from the plasma generation region 25 in mutually different radiation directions. The processor 5 controls the actuator 344 as setting the target irradiation position Pop of the pulse laser light 33 to the laser irradiation position away from the reference position Pini, at which the average value Eavg of the radiation energies E1, E2 measured by the EUV sensors ES1, ES2 is maximized in the direction toward the EUV light concentrating mirror 23*a*.

According to this, the radiation energy distribution of the EUV light can be inclined such that the radiation energy E of the EUV light toward the EUV light concentrating mirror 23*a* is increased by irradiating the laser irradiation position away from the reference position Pini in the direction toward the EUV light concentrating mirror 23*a* with the pulse laser light 33. As a result, it is possible to increase the output energy of the EUV light reaching the intermediate focal point 292.

(2) According to the first embodiment, the processor 5 acquires, as the improved irradiation position Pmax, the laser irradiation position at which the output energy of the EUV light reaching the intermediate focal point 292 becomes larger than that when the reference position Pini is irradiated with the pulse laser light 33. The processor 5 sets the target irradiation position Pop based on the improved irradiation position Pmax.

According to this, the target irradiation position Pop can be set such that the output energy becomes larger than that when the reference position Pini is irradiated with the pulse laser light 33.

(3) According to the first embodiment, the processor 5 irradiates the target 27 with the pulse laser light 33 while changing the laser irradiation position, acquires the measurement result of the output energy at each laser irradiation position, and acquires the improved irradiation position Pmax based on the measurement result.

According to this, by acquiring the improved irradiation position Pmax based on the actual measurement result, it is possible to accurately obtain the improved irradiation position Pmax at which the output energy is increased.

(4) According to the first embodiment, the improved irradiation position Pmax is the laser irradiation position at which the output energy of the EUV light reaching the intermediate focal point 292 is maximized.

According to this, the output power of the EUV light can be increased.

(5) According to the first embodiment, the processor 5 sets the target irradiation position Pop to the laser irradiation position away from the reference position Pini in the direction toward the improved irradiation position Pmax.

According to this, it is possible to set the target irradiation position Pop so as to increase the output energy of the EUV light.

(6) According to the first embodiment, when the distance between the reference position Pini and the improved irradiation position Pmax is equal to or less than the allowable value dPfrg, the processor 5 sets the target irradiation position Pop to the improved irradiation position Pmax. When the distance between the reference position Pini and the improved irradiation position Pmax is larger than the allowable value dPfrg, the processor 5 sets the target irradiation position Pop to a position away from the reference position Pini in the direction toward the improved irradiation position Pmax by the allowable value dPfrg.

According to this, it is possible to suppress a problem caused by the laser irradiation position being shifted from the reference position Pini while increasing the output energy of the EUV light as much as possible.

(7) According to the first embodiment, the processor 5 sets the target irradiation position Pop such that the distance between the reference position Pini and the target irradiation position Pop is equal to or less than the allowable value dPfrg set to be less than the radius of the target 27.

According to this, it is possible to suppress a problem caused by the laser irradiation position being shifted from the reference position Pini.

(8) According to the first embodiment, the allowable value dPfrg is 3 μm or more and 8 μm or less.

According to this, it is possible to suppress the problem caused by the laser irradiation position being shifted from the reference position Pini while increasing the output energy of the EUV light.

(9) According to the first embodiment, the processor 5 sets the target irradiation position Pop such that the generation amount of debris derived from the target 27 is equal to or less than the allowable value.

According to this, it is possible to suppress generation of debris caused by deviation of the laser irradiation position from the reference position Pini.

(10) According to the first embodiment, the plurality of EUV sensors include the EUV sensor ES1 and the EUV sensor ES2 having a smaller deviation in the direction centered at the plasma generation region 25 with respect to the EUV light concentrating mirror 23*a* than the EUV sensor ES1. The processor 5 controls the actuator 344 so that the correction average value Ewavg obtained by correcting any of the radiation energies E1, E2 so as to emphasize the radiation energy E2 measured by the EUV sensor ES2 over the radiation energy E1 measured by the EUV sensor ES1 becomes larger when the laser irradiation position is irradiated with the pulse laser light 33 than when the reference position Pini is irradiated with the pulse laser light 33.

According to this, by emphasizing the radiation energy E2 measured by the EUV sensor ES2 whose direction from the plasma generation region 25 is close to the EUV light concentrating mirror 23*a*, irradiation of the pulse laser light 33 can be performed with the radiation distribution inclined toward the EUV light concentrating mirror 23*a*.

(11) According to the first embodiment, the processor 5 controls the actuator 344 so that the laser irradiation position at which the correction average value Ewavg is maximized is irradiated with the pulse laser light 33.

According to this, by maximizing the correction average value Ewavg, the optimum laser irradiation position can be irradiated with the pulse laser light 33.

(12) According to the first embodiment, the processor 5 corrects any of the radiation energies E1, E2 so that the correction average value Ewavg becomes larger when the target irradiation position Pop is irradiated with the pulse laser light 33 than when the reference position Pini is irradiated with the pulse laser light 33.

According to this, by performing correction so that the correction average value Ewavg when the target irradiation position Pop is irradiated with the pulse laser light 33 is increased, it is possible to irradiate the optimum laser irradiation position in the control based on the correction average value Ewavg.

(13) According to the first embodiment, the processor 5 calculates the correction coefficient k1 or k2 for correcting any of the radiation energies E1, E2 based on the positional deviation dP(dx, dy) between the reference position Pini and the target irradiation position Pop.

According to this, by calculating the correction coefficient k1 or k2 based on the positional deviation dP(dx, dy), it is possible to correct any of the radiation energies E1, E2 so that the target irradiation position Pop can be irradiated.

(14) According to the first embodiment, the processor 5 calculates, based on the positional deviation dP(dx, dy), the EUV radiation direction R(θt, Φt) in which the radiation energy E becomes larger than that in the −Z direction opposite to the incident direction of the pulse laser light 33 entering the plasma generation region 25. The processor 5 calculates the correction coefficient k1 or k2 such that the direction of the correction geometric centroid vector C obtained by weighting any of the first and second position vectors P1, P2 indicating the positions of the EUV sensors ES1, ES2 with the correction coefficient k1 or k2 is closer to the EUV radiation direction R(θt, Φt) than the −Z direction opposite to the incident direction.

According y calculating the correction coefficient k1 or k2 such that the direction of the correction geometric centroid vector C of the EUV sensors ES1, ES2 becomes close to the EUV radiation direction R(θt, Φt), the radiation energy E can be inclined in the EUV radiation direction R(θt, Φt) in the control of the laser irradiation position based on the correction average value Ewavg.

(15) According to the first embodiment, the processor 5 calculates, based on the positional deviation dP(dx, dy), the EUV radiation direction R(θt, Φt) in which the radiation energy E is maximized as a maximum radiation direction. The processor 5 calculates the correction coefficient k1 or k2 such that the direction of the correction geometric centroid vector C obtained by weighting any of the first and second position vectors P1, P2 indicating the positions of the EUV sensors ES1, ES2 with the correction coefficient k1 or k2 coincides with the maximum radiation direction.

According to this, by calculating the correction coefficient k1 or k2 such that the direction of the correction geometric centroid vector C of the EUV sensors ES1, ES2 coincides with the maximum radiation direction of the EUV light, the radiation energy E can be inclined in the maximum radiation direction in the control of the laser irradiation position based on the correction average value Ewavg.

(16) According to the first embodiment, the processor 5 calculates the correction coefficient k1 or k2 such that the direction component, perpendicular to the optical path axis of the pulse laser light 33, of the correction geometric centroid vector C obtained by weighting any of the first and second position vectors P1 and P2 indicating the positions of the EUV sensors ES1, ES2 with the correction coefficient k1 or k2 for obtaining the correction average value Ewavg is the direction toward the EUV light concentrating mirror 23*a* from the optical path axis.

According to this, by calculating the correction coefficient k1 or k2 such that the direction of the correction geometric centroid vector C of the EUV sensors ES1, ES2 becomes close to the EUV light concentrating mirror 23*a*, the radiation energy E can be inclined in the direction toward the EUV light concentrating mirror 23*a* in the control of the laser irradiation position based on the correction average value Ewavg.

(17) According to the first embodiment, the processor 5 corrects the correction coefficient k1 or k2 when the distance between the laser irradiation position at which the correction average value Ewavg is maximized and the target irradiation position Pop is equal to or more than the threshold value.

According to this, it is possible to determine whether or not the calculated correction coefficient k1 or k2 is appropriate and to correct the correction coefficient k1 or k2.

In other respects, the first embodiment is similar to the comparative example.

4. EUV Light Generation System 11*b* Including Prepulse Laser Device PPL

4.1 Configuration

Figure 23:
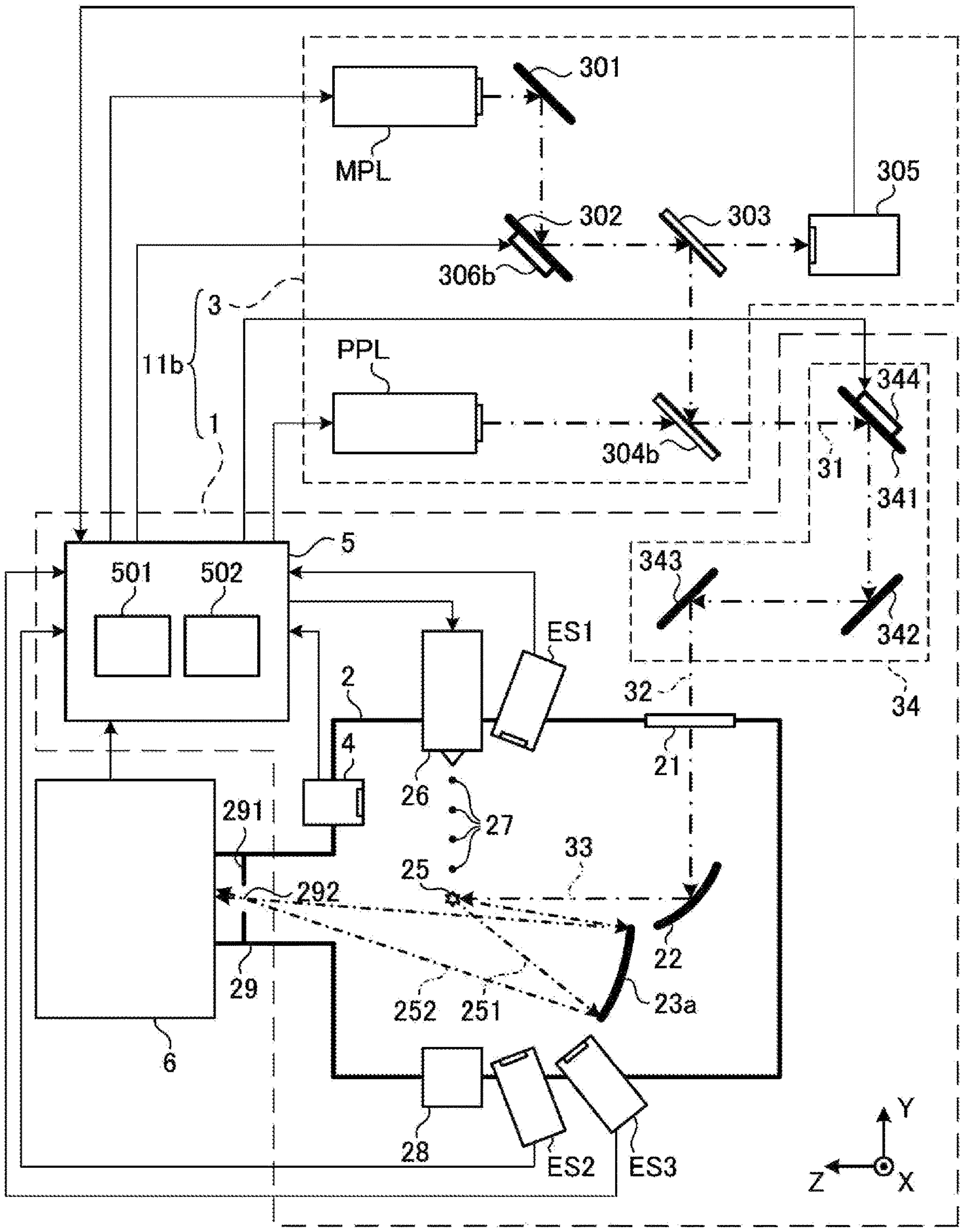
FIG. 23 schematically shows the configuration of the EUV light generation system according to a second embodiment.

FIG. 23 schematically shows the configuration of an EUV light generation system 11*b* according to a second embodiment. In FIG. 23, the laser system 3 includes a prepulse laser device PPL in addition to the main pulse laser device MPL. Further, a beam combiner 304*b* is included instead of the high reflection mirror 304 shown in FIG. 14. An actuator 306*b* is arranged at the high reflection mirror 302.

Before the pulse laser light 33 output from the main pulse laser device MPL is radiated to the target 27, the prepulse laser device PPL outputs prepulse laser light to be radiated to the target 27. The prepulse laser light diffuses the droplet-shaped target 27 to reduce the density of the target 27, so that the pulse laser light 33 output from the main pulse laser device MPL can efficiently excite the target 27 to turn the target 27 into plasma.

The beam combiner 304*b* reflects one of the pulse laser light 31 output from the main pulse laser device MPL and the prepulse laser light output from the prepulse laser device PPL and transmits the other thereof so that the optical paths of the both substantially coincide with each other. As a result, the prepulse laser light enters the plasma generation region 25 as passing through the optical path common with the pulse laser light 31, 32, 33 output from the main pulse laser device MPL.

The actuator 306*b* controls the position or posture of the high reflection mirror 302 on which the pulse laser light 31 output from the main pulse laser device MPL is incident before merging with the prepulse laser light. Accordingly, the optical path axis of the pulse laser light 31 can be adjusted separately from the prepulse laser light. The actuator 344 can adjust both the optical path axis of the pulse laser light 31 and the optical path axis of the prepulse laser light.

4.2 Operation

The laser irradiation position away from the reference position Pini in the direction toward the EUV light concentrating mirror 23*a* is irradiated with the pulse laser light 33 output from the main pulse laser device MPL, whereas a position closer to the reference position Pini than the laser irradiation position of the pulse laser light 33 is irradiated with the prepulse laser light. Preferably, the optical path axis of the prepulse laser light coincides with the center of the droplet-shaped target 27. Accordingly, the target 27 can be diffused substantially axisymmetrically with respect to the optical path axis of the prepulse laser light.

4.3 Effect

(18) According to the second embodiment, the EUV light generation system 11*b* includes the prepulse laser device PPL that outputs prepulse laser light that is radiated to the target 27 before the target 27 is irradiated with the pulse laser light 33. The position closer to the reference position Pini than the laser irradiation position of the pulse laser light 33 is irradiated with the prepulse laser light.

According to this, by irradiating the position close to the reference position Pini with the prepulse laser light, it is possible to improve the diffusion state of the target 27.

In other respects, the second embodiment is similar to the first embodiment.

5. Others

5.1 Example of EUV Light Utilization Apparatus 6

Figure 24:
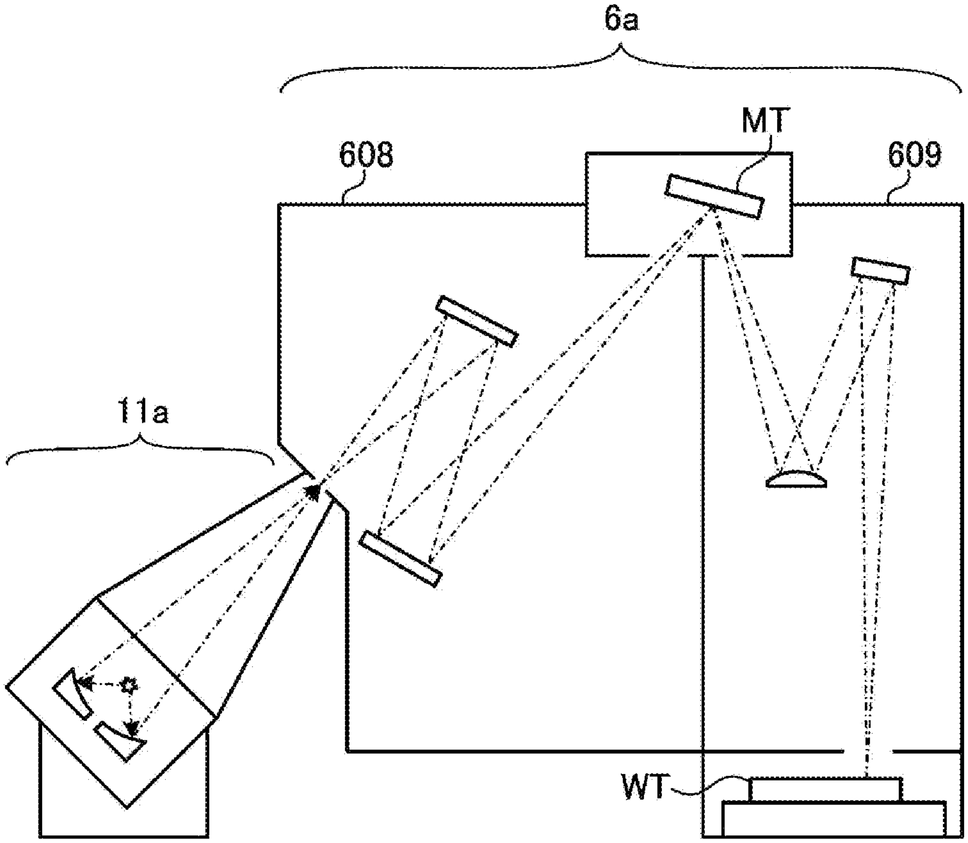
FIG. 24 schematically shows the configuration of an exposure apparatus connected to the EUV light generation system.

FIG. 24 schematically shows the configuration of the exposure apparatus 6*a* connected to the EUV light generation system 11*a*.

In FIG. 24, the exposure apparatus 6*a* as the EUV light utilization apparatus 6 (see FIG. 1) includes a mask irradiation unit 608 and a workpiece irradiation unit 609. The mask irradiation unit 608 illuminates, via a reflection optical system, a mask pattern of a mask table MT with the EUV light incident from the EUV light generation system 11*a*. The workpiece irradiation unit 609 images the EUV light reflected by the mask table MT onto a workpiece (not shown) arranged on a workpiece table WT via the reflection optical system. The workpiece is a photosensitive substrate such as a semiconductor wafer on which photoresist is applied. The exposure apparatus 6*a* synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

Figure 25:
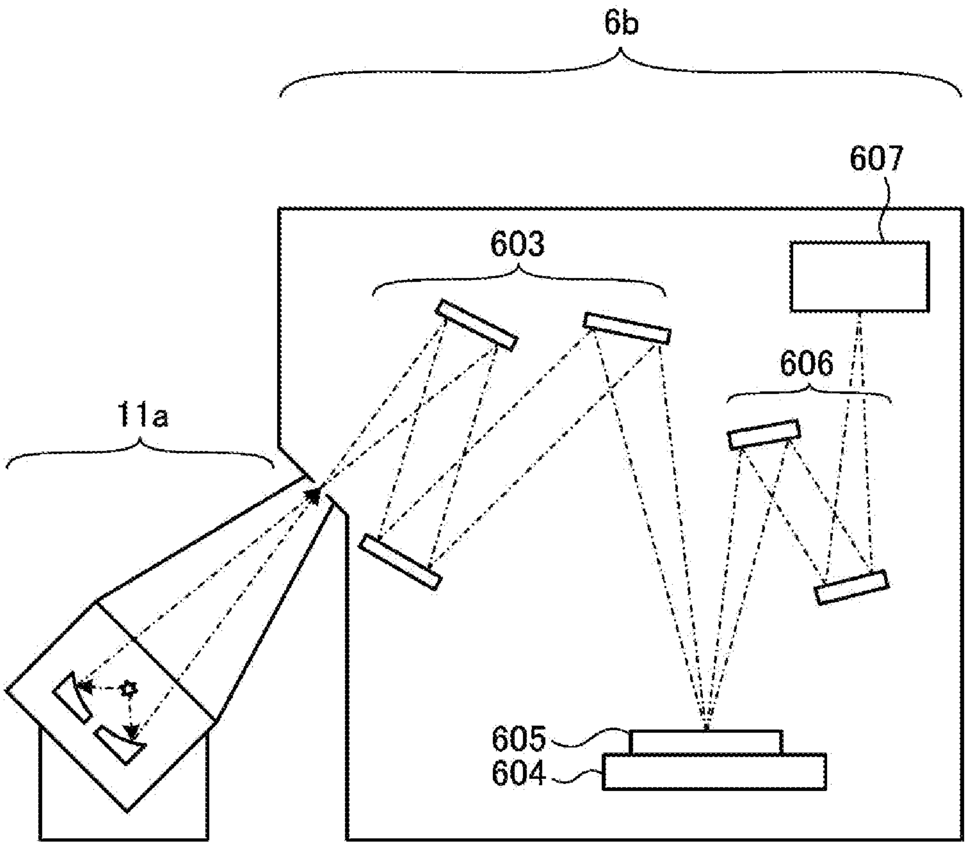
FIG. 25 schematically shows the configuration of an inspection apparatus connected to the EUV light generation system.

FIG. 25 schematically shows the configuration of the inspection apparatus 6*b* connected to the EUV light generation system 11*a*.

In FIG. 25, the inspection apparatus 6*b* as the EUV light utilization apparatus 6 (see FIG. 1) includes an illumination optical system 603 and a detection optical system 606. The illumination optical system 603 reflects the EUV light incident from the EUV light generation system 11*a* to illuminate a mask 605 placed on a mask stage 604. Here, the mask 605 conceptually includes a mask blanks before a pattern is formed. The detection optical system 606 reflects the EUV light from the illuminated mask 605 and forms an image on a light receiving surface of a detector 607. The detector 607 having received the EUV light obtains the image of the mask 605. The detector 607 is, for example, a time delay integration (TDI) camera. A defect of the mask 605 is inspected based on the image of the mask 605 obtained by the above-described process, mask and a suitable for manufacturing an electronic device is selected using the inspection result. Then, the electronic device can be manufactured by exposing and transferring the pattern formed on the selected mask onto the photosensitive substrate using the exposure apparatus 6*a*.

Although FIGS. 24 and 25 show the EUV light generation system 11*a* according to the first embodiment, the EUV light generation system 11*b* according to the second embodiment may be used.

5.2 Supplement

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as “comprise”, “include”, “have”, and “contain” should not be interpreted to be exclusive of other structural elements. Further, indefinite articles “a/an” described in the present specification and the appended claims should be interpreted to mean “at least one” or “one or more.” Further, “at least one of A, B, and C” should be interpreted to mean any of A, B, C, A+B, A+C, B+C, and A+B+C as well as to include combinations of the any thereof and any other than A, B, and C.

What is claimed is:

1. An extreme ultraviolet light generation system comprising:

a chamber including a first region;

a target supply unit configured to supply a target to the first region;

a laser device configured to output pulse laser light;

an optical system including an optical element configured to guide the pulse laser light to the first region;

an irradiation position adjustment mechanism configured to adjust a laser irradiation position with respect to the target in a plane being perpendicular to an optical path axis of the pulse laser light entering the first region and intersecting the first region by changing a position or posture of the optical element;

an EUV light concentrating mirror configured to reflect EUV light radiated from the first region and concentrate the EUV light to a second region, and arranged such that the pulse laser light passes outside the EUV light concentrating mirror and is guided to the first region;

a plurality of EUV sensors configured to measure radiation energies of the EUV light radiated from the first region in mutually different radiation directions; and a processor configured to control the irradiation position adjustment mechanism as setting a target irradiation position of the pulse laser light to a laser irradiation position away from a reference position, at which an average value of the radiation energies measured by the EUV sensors is maximized, in a direction toward the EUV light concentrating mirror, wherein the processor acquires, as an improved irradiation position, a laser irradiation position at which an output energy of the EUV light reaching the second region becomes larger than that when the reference position is irradiated with the pulse laser light, and sets the target irradiation position based on the improved irradiation position, the processor sets the target irradiation position to a laser irradiation position away from the reference position in a direction toward the improved irradiation position, and the processor sets the target irradiation position such that the distance between the reference position and the target irradiation position is equal to or less than an allowable value set to be less than a radius of the target.

2. The extreme ultraviolet light generation system according to claim 1, wherein the processor irradiates the target with the pulse laser light while changing the laser irradiation position, acquires a measurement result of the output energy at each laser irradiation position, and acquires the improved irradiation position based on the measurement result.

3. The extreme ultraviolet light generation system according to claim 1, wherein the improved irradiation position is the laser irradiation position at which the output energy of the EUV light reaching the second region is maximized.

4. The extreme ultraviolet light generation system according to claim 1, wherein the processor sets the target irradiation position to the improved irradiation position when a distance between the reference position and the improved irradiation position is equal to or less than an allowable value, and to a position away from the reference position in the direction toward the improved irradiation position by the allowable value when the distance between the reference position and the improved irradiation position is larger than the allowable value.

5. The extreme ultraviolet light generation system according to claim 1, wherein the allowable value is equal to or more than 3 μm and equal to or less than 8 μm.

6. The extreme ultraviolet light generation system according to claim 1, wherein, the processor sets the target irradiation position such that a generation amount of debris derived from the target is equal to or less than an allowable value.

7. The extreme ultraviolet light generation system according to claim 1, wherein the plurality of sensors include a first sensor and a second sensor having a smaller deviation in a direction centered at the first region with respect to the EUV light concentrating mirror than the EUV sensor, and the processor controls the irradiation position adjustment mechanism so that the laser irradiation position, at which a correction average value of the radiation energies obtained by correcting any of first and second radiation energies so as to emphasize the second radiation energy measured by the second sensor over the first radiation energy measured by the first sensor becomes larger than that when the reference position is irradiated with the pulse laser light, is irradiated with the pulse laser light.

8. The extreme ultraviolet light generation system according to claim 7, wherein the processor controls the irradiation position adjustment mechanism so that the laser irradiation position at which the correction average value is maximized is irradiated with the pulse laser light.

9. The extreme ultraviolet light generation system according to claim 7, wherein the processor corrects any of the first and second radiation energies so that the correction average value becomes larger when the target irradiation position is irradiated with the pulse laser light than when the reference position is irradiated with the pulse laser light.

10. The extreme ultraviolet light generation system according to claim 7, wherein the processor calculates a correction coefficient for correcting any of the first and second radiation energies based on a positional deviation between the reference position and the target irradiation position.

11. The extreme ultraviolet light generation system according to claim 10, wherein the processor calculates an EUV radiation direction in which the radiation energy is larger than that in a direction opposite to an incident direction of the pulse laser light entering the first region based on the positional deviation, and calculates the correction coefficient such that a direction of a correction geometric centroid vector obtained by weighting any of first and second position vectors indicating positions of the first and second sensors is oriented closer to the EUV radiation direction than the direction opposite to the incident direction.

12. The extreme ultraviolet light generation system according to claim 10, wherein the processor calculates, based on the positional deviation, an EUV radiation direction in which the radiation energy is maximized as a maximum radiation direction, and calculates the correction coefficient such that a direction of a correction geometric centroid vector obtained by weighting any of first and second position vectors indicating positions of the first and second sensors coincides with the maximum radiation direction.

13. The extreme ultraviolet light generation system according to claim 7, wherein the processor calculates the correction coefficient such that a direction component, perpendicular to the optical path axis, of a correction geometric centroid vector obtained by weighting any of first and second position vectors indicating positions of the first and second sensors with a correction coefficient for obtaining the correction average value is oriented in a direction toward the EUV light concentrating mirror from the optical path axis.

14. The extreme ultraviolet light generation system according to claim 13, wherein the processor corrects the correction coefficient when a distance between the laser irradiation position at which the correction average value is maximized and the target irradiation position is equal to or more than a threshold value.

15. The extreme ultraviolet light generation system according to claim 1, further comprising a prepulse laser device configured to output prepulse laser light to be radiated to the target before the target is irradiated with the pulse laser light, wherein a position closer to the reference position than the laser irradiation position of the pulse laser light is irradiated with the prepulse laser light.

16. An electronic device manufacturing method, comprising:

generating EUV light using an extreme ultraviolet light generation system; and outputting the EUV light to an exposure apparatus and exposing a photosensitive substrate to the EUV light in the exposure apparatus to manufacture an electronic device, the extreme ultraviolet light generation system including:

a chamber including a first region;

a target supply unit configured to supply a target to the first region;

a laser device configured to output pulse laser light;

an optical system including an optical element configured to guide the pulse laser light to the first region;

an irradiation position adjustment mechanism configured to adjust a laser irradiation position with respect to the target in a plane being perpendicular to an optical path axis of the pulse laser light entering the first region and intersecting the first region by changing a position or posture of the optical element;

an EUV light concentrating mirror configured to reflect the EUV light radiated from the first region and concentrate the EUV light to a second region, and arranged such that the pulse laser light passes outside the EUV light concentrating mirror and is guided to the first region;

a plurality of EUV sensors configured to measure radiation energies of the EUV light radiated from the first region in mutually different radiation directions; and a processor configured to control the irradiation position adjustment mechanism as setting a target irradiation position of the pulse laser light to a laser irradiation position away from a reference position, at which an average value of the radiation energies measured by the EUV sensors is maximized, in a direction toward the EUV light concentrating mirror, wherein the processor acquires, as an improved irradiation position, a laser irradiation position at which an output energy of the EUV light reaching the second region becomes larger than that when the reference position is irradiated with the pulse laser light, and sets the target irradiation position based on the improved irradiation position, the processor sets the target irradiation position to a laser irradiation position away from the reference position in a direction toward the improved irradiation position, and the processor sets the target irradiation position such that the distance between the reference position and the target irradiation position is equal to or less than an allowable value set to be less than a radius of the target.

17. An electronic device manufacturing method, comprising:

inspecting a defect of a mask by irradiating the mask with EUV light generated by an extreme ultraviolet light generation system;

selecting a mask using a result of the inspection; and exposing and transferring a pattern formed on the selected mask onto a photosensitive substrate, the extreme ultraviolet light generation system including:

a chamber including a first region;

a target supply unit configured to supply a target to the first region;

a laser device configured to output pulse laser light;

an optical system including an optical element configured to guide the pulse laser light to the first region;

an irradiation position adjustment mechanism configured to adjust a laser irradiation position with respect to the target in a plane being perpendicular to an optical path axis of the pulse laser light entering the first region and intersecting the first region by changing a position or posture of the optical element;

an EUV light concentrating mirror configured to reflect the EUV light radiated from the first region and concentrate the EUV light to a second region, and arranged such that the pulse laser light passes outside the EUV light concentrating mirror and is guided to the first region;

a plurality of EUV sensors configured to measure radiation energies of the EUV light radiated from the first region in mutually different radiation directions; and a processor configured to control the irradiation position adjustment mechanism as setting a target irradiation position of the pulse laser light to a laser irradiation position away from a reference position, at which an average value of the radiation energies measured by the EUV sensors is maximized, in a direction toward the EUV light concentrating mirror, wherein the processor acquires, as an improved irradiation position, a laser irradiation position at which an output energy of the EUV light reaching the second region becomes larger than that when the reference position is irradiated with the pulse laser light, and sets the target irradiation position based on the improved irradiation position, the processor sets the target irradiation position to a laser irradiation position away from the reference position in a direction toward the improved irradiation position, and the processor sets the target irradiation position such that the distance between the reference position and the target irradiation position is equal to or less than an allowable value set to be less than a radius of the target.

* * * * *